United States Patent
Lee et al.

(10) Patent No.: US 7,905,952 B2
(45) Date of Patent: Mar. 15, 2011

(54) BLUE PHTHALOCYANINE PIGMENT COMPOSITION AND ITS PREPARATION

(75) Inventors: HyeonKook Lee, Ulsan (KR); JangWon Jung, Ulsan (KR); Takashi Deno, Nishinomiya (JP); Masaki Ohwa, Kobe (JP)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 12/520,626

(22) PCT Filed: Jan. 28, 2008

(86) PCT No.: PCT/EP2008/050916
§ 371 (c)(1),
(2), (4) Date: Aug. 4, 2009

(87) PCT Pub. No.: WO2008/095801
PCT Pub. Date: Aug. 14, 2008

(65) Prior Publication Data
US 2009/0293769 A1    Dec. 3, 2009

(30) Foreign Application Priority Data
Feb. 7, 2007    (EP) .................................... 07101892

(51) Int. Cl.
C09B 67/04    (2006.01)
C09B 67/22    (2006.01)
C09B 67/50    (2006.01)
G03F 7/00    (2006.01)

(52) U.S. Cl. ........ 106/411; 106/410; 106/412; 106/413; 313/112; 428/1.1; 428/1.6; 540/140; 540/141

(58) Field of Classification Search .................. 106/410, 106/411, 412, 413; 313/112; 430/7; 540/140, 540/141; 428/1.1, 1.6
See application file for complete search history.

(56) References Cited

U.S. PATENT DOCUMENTS

| | | | |
|---|---|---|---|
| 4,135,944 A | 1/1979 | Wheeler | |
| 5,776,237 A | 7/1998 | Tomiya et al. | |
| 6,468,341 B2 | 10/2002 | Wada et al. | |
| 6,544,325 B2 * | 4/2003 | Hall-Goulle et al. | ......... 106/410 |
| 7,211,664 B2 * | 5/2007 | Shiromaru | ..................... 540/145 |
| 7,255,733 B2 | 8/2007 | Shiromaru et al. | |
| 2005/0215780 A1 * | 9/2005 | Shiromaru | ..................... 540/141 |
| 2010/0086868 A1 * | 4/2010 | Metz et al. | ............... 430/108.21 |

FOREIGN PATENT DOCUMENTS

| | | |
|---|---|---|
| EP | 0 638 615 A2 | 8/1994 |
| EP | 0 808 878 A2 | 11/1997 |
| EP | 1 130 065 A2 | 9/2001 |
| EP | 1 489 143 A1 | 12/2004 |
| GB | 1 411 880 | 10/1975 |
| JP | 48-76925 | 10/1973 |
| JP | 49/059136 | 7/1974 |
| JP | 1-152141 | 6/1989 |
| JP | 2000-258620 | 9/2000 |
| JP | 2005-234009 | 9/2005 |
| JP | 2007-248778 | 9/2007 |

OTHER PUBLICATIONS

English language abstract No. 2007-768901[72] of JP 2007/248778 [Sep. 2007].
English language abstract No. 1997-267846[24] of JP 9/095638 [Apr. 1997].
English language abstract No. 2004-664126[65] of JP 2004/252443 [Sep. 2004].
English language abstract No. 2002-676895[73] of JP 2002/121420 [Apr. 2002].
English language abstract No. 2007-180929[18] of JP 2007/009007 [Jan. 2007].
English language abstract No. 84-184833/30 of JP 59/102958 [Jun. 1984].
English language abstract No. 1989-215735[30] of JP 1/152141 [Jun. 1989].
Translation of JP 48-76925 [Oct. 1973].
Translation of JP 49/059136 [Jun. 1974].
Translation of JP 2005-234009 [Sep. 2005].

* cited by examiner

*Primary Examiner* — Anthony J Green
(74) *Attorney, Agent, or Firm* — Shiela A. Loggins

(57) ABSTRACT

The invention pertains to pigment compositions comprising from 70 to 93%, preferably from 81 to 93%, of e copper phthalocyanine, from to 18% of an aminomethyl-substituted phthalocyanine, from 2 to 15% of an ammonium sulfonato phthalocyanine and less than 2% of other phthalocyanine compounds, preferably 5 made by wet-milling a mixture of a copper phthalocyanine and e copper phthalocyanine together with the aminomethyl-substituted phthalocyanine and a milling aid in an organic liquid and adding the ammonium sulfonato phthalocyanine before the milling aid and the organic liquid are separated from the wet-milled mixture.

15 Claims, No Drawings

BLUE PHTHALOCYANINE PIGMENT COMPOSITION AND ITS PREPARATION

The invention pertains to the field of color filters. Normally, trichromatism is achieved by using each a blue, red and green filter. These filters must be highly transparent, homogeneous and have a very uniform layer thickness.

The correct position and the absolute value of the transmission window are very important parameters for color filters. There is a desire for high transmission in the wavelength range surrounding the light emission, coupled with as high as possible an absorption for different-colored light. In addition, there is a strongly increasing demand for a higher display contrast (ratio of luminances in the ON/OFF states).

Though there have been many proposals to improve the properties of ε copper phthalocyanine (C. I. Pigment Blue 15:6), the desired properties have not yet been obtained and the still increasing requirements are not fully satisfied.

EP-A-1 489 143 discloses pigment compositions comprising copper phthalocyanine and at least one compound selected from the group consisting of aminomethyl-substituted phthalocyanines, phthalimidomethyl phthalocyanines and ammonium salts of sulfonated phthalocyanines. However, the β crystal form (C. I. Pigment Blue 15:4) is not suitable for color filters due to its greenish blue hue.

JP-A-H01/152 141 discloses blends comprising ε copper phthalocyanine, phthalimidomethyl copper phthalocyanine and sulfonated copper phthalocyanine or an alkali metal salt thereof. The purpose is to avoid mechanical pulverisation of the pigment for use in thermoplastic resins. However, the transparency is insufficient for use in color filters.

EP-A-1 130 065 discloses pigment compositions comprising ε copper phthalocyanine and azo or other polycyclic pigments. Phthalocyanine derivatives may optionally be added, for example amongst many others phthalocyanines with phthalimidomethyl and/or sulfonic groups or salts thereof. In comparative example 1 of EP-A-1 130 065, α copper phthalocyanine is salt-kneaded together with phthalimidomethyl copper phthalocyanine and a small amount of ε copper phthalocyanine, leading to a product which is coloristically inferior according to comparative example 2 of EP-A-1 130 065.

JP-A-2000/258 620 discloses a process wherein acid-pasted pure α copper phthalocyanine is salt-kneaded together with a crystal stabilizer selected from phthalocyanine derivatives such as for example copper phthalocyanine having phthalimidomethyl or ammonium sulfo groups. The importance of the product not to contain more than 3% of non-phthalocyanine impurities is emphasized. However, there is no quantitative conversion to the ε crystal phase, and the hue, contrast as well as thermal stability are not fully satisfactory. JP-A-2000/258 620 fails to disclose the use of ε copper phthalocyanine as a further starting material.

JP-A-2005/234 009 uses an entirely different approach, starting from a modified ε copper phthalocyanine stabilized with a copper phthalocyanine sulfonamide, which is salt-kneaded with phthalimidomethyl copper phthalocyanine then removing the organic solvent and the inorganic salt and subsequently performing surface treatment with a sulfonated copper phthalocyanine or its salt. Potassium, sodium, calcium, strontium, aluminum, ammonium and lower alkyl ammonium cations are disclosed. These compositions, however, consist of aggregates of excessively small, fragile primary particles. Thus, it is difficult to obtain reproducible coloristic properties.

EP-A-0 808 878 discloses a process for producing β copper phthalocyanine pigment compositions for printing inks by dry-milling together with a resin in the absence of oxygen.

Surprisingly, a new, simple way was now found, which leads to blue pigment compositions better fulfilling the requirements of the color filter industry.

The properties of reddish-blue colors filters are enhanced to an amazing degree by using pigment compositions comprising from 70 to 93%, preferably from 81 to 93%, of ε copper phthalocyanine, from 5 to 18% of an aminomethyl-substituted phthalocyanine, from 2 to 15% of an ammonium sulfonato phthalocyanine and less than 2% of other phthalocyanine compounds, preferably made by wet-milling a mixture of α copper phthalocyanine and ε copper phthalocyanine together with the aminomethyl-substituted phthalocyanine and a milling aid in an organic liquid and adding the ammonium sulfonato phthalocyanine before the milling aid and the organic liquid are separated from the wet-milled mixture.

Thus, the invention relates to a process for the preparation of a pigment composition, comprising the steps of:
wet-milling α mixture of a copper phthalocyanine and ε copper phthalocyanine together with an aminomethyl-substituted phthalocyanine of formula (I), or a mixture thereof, and a milling aid in an organic liquid;

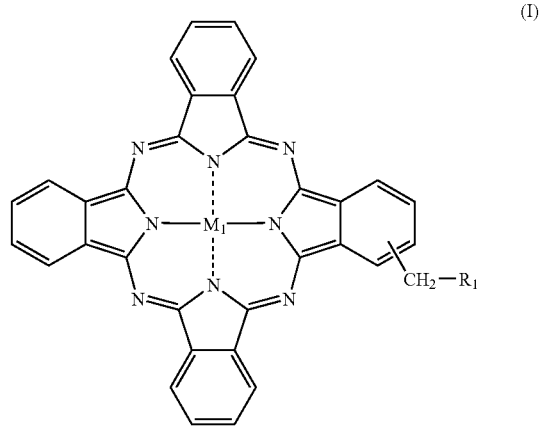

(I)

wherein $M_1$ is 2 H, Al(Cl), Al(OH), Bi(OH), Ca, Cd, Ce(Cl), Cr(OH), Co, Cu, Mn, Fe, Fe(Cl), Fe(OH), In(Cl), Mg, Mn(O), Ni, Os, Pb, Pd, Pt, Re, Rh, Rh(O), Ru, Si(Cl)$_2$, Si(OC$_1$-C$_5$alkyl)$_2$, Si(OH)$_2$, Sn, Sr, Ti(O), V(O), Zn, Zr(O) or Zr(OH)$_2$, preferably 2 H, Co, Cu or Ni, most preferred Cu;

$R_1$ is

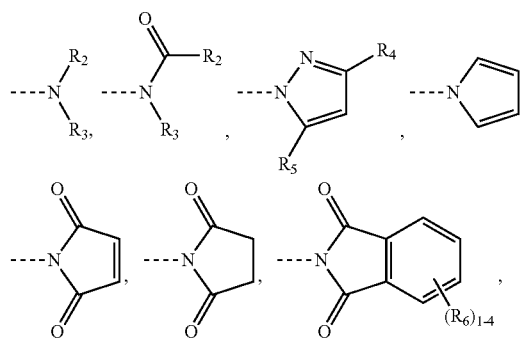

-continued

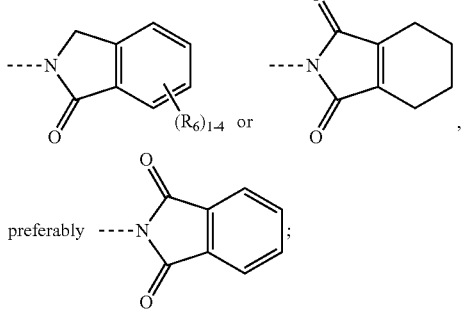

preferably $R_2$ is

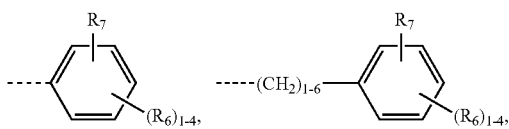

$C_1$-$C_{20}$alkyl, $C_2$-$C_{20}$alkenyl, [$C_2$-$C_6$alkylen-O—]$_{1-3}$H, [$C_2$-$C_6$alkylen-O—]$_{1-3}$—$C_1$-$C_8$alkyl, [$C_2$-$C_6$alkylen-NH—]$_{1-3}$—$C_1$-$C_8$alkyl or [$C_2$-$C_6$alkylen-N($C_1$-$C_4$alkyl)-]$_{1-3}$$C_1$-$C_8$alkyl;

$R_3$ is H, $C_1$-$C_{20}$alkyl, $C_2$-$C_{20}$alkenyl, [$C_2$-$C_6$alkylen-O—]$_{1-3}$H, [$C_2$-$C_6$alkylen-O—]$_{1-3}$—$C_1$-$C_8$alkyl or [$C_2$-$C_6$alkylen-N($C_1$-$C_4$alkyl)-]$_{1-3}$$C_1$-$C_8$alkyl;

$R_4$ and $R_5$ are independently from one another H or $C_1$-$C_6$alkyl, preferably both H or both methyl;

each $R_6$ is independently from all others H, $C_1$-$C_8$alkyl, Cl or $NO_2$; and $R_7$ is H, COOH, $CONH_2$, $CONHC_1$-$C_8$alkyl or CON($C_1$-$C_8$alkyl)$_2$;

adding an ammonium sulfonato phthalocyanine of formula (II), or a mixture thereof, before the milling aid and the organic liquid are separated from the wet-milled mixture;

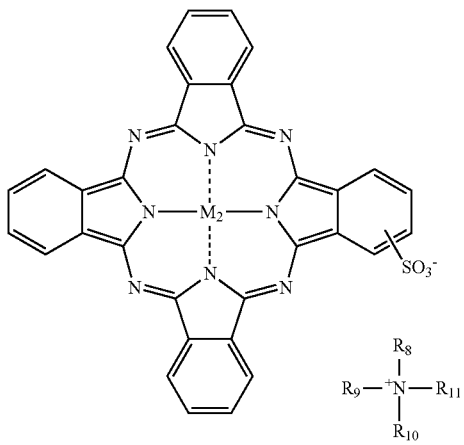

(II)

wherein $M_2$ is 2 H, Al(Cl), Al(OH), Bi(OH), Ca, Cd, Ce(Cl), Cr(OH), Co, Cu, Mn, Fe, Fe(Cl), Fe(OH), In(Cl), Mg, Mn(O), Ni, Os, Pb, Pd, Pt, Re, Rh, Rh(O), Ru, Si(Cl)$_2$, Si(OC$_1$-$C_5$alkyl), Si(OH)$_2$, Sn, Sr, Ti(O), V(O), Zn, Zr(O) or Zr(OH)$_2$, preferably 2 H, Co, Cu or Ni, most preferred Cu;

$R_8$ and $R_9$ are each independently of one another H or $C_1$-$C_4$alkyl, preferably H or methyl, particularly preferred H;

$R_{10}$ is H, phenyl, benzyl, 2-phenylethyl, naphthyl, $C_1$-$C_{20}$alkyl, $C_8$-$C_{20}$alkenyl, [$C_2$-$C_6$alkylen-O—]$_{1-6}$H, [$C_2$-$C_6$alkylen-O—]$_{1-6}$$C_1$-$C_8$alkyl, [$C_2$-$C_6$alkylen-NH—]$_{1-6}$—$C_1$-$C_8$alkyl or [$C_2$-$C_6$alkylen-N($C_1$-$C_4$alkyl)-]$_{1-6}$$C_1$-$C_8$alkyl, preferably H; and $R_{11}$ is $C_8$-$C_{20}$alkyl, $C_8$-$C_{20}$alkenyl, [$C_2$-$C_6$alkylen-O—]$_{3-6}$H, [$C_2$-$C_6$alkylen-O—]$_{3-6}$—$C_1$-$C_8$alkyl, [$C_2$-$C_6$alkylen-NH—]$_{3-6}$$C_1$-$C_8$alkyl or [$C_2$-$C_6$alkylen-N($C_1$-$C_4$alkyl)-]$_{3-6}$—$C_1$-$C_8$alkyl, preferably $C_8$-$C_{20}$alkyl or $C_8$-$C_{20}$alkenyl, most preferred $C_{10}$-$C_{18}$alkyl;

with the proviso that the total number of carbon atoms in $R_8$, $R_9$, $R_{10}$ and $R_{11}$ is from 8 to 30;

separating the milling aid and the organic liquid from the wet-milled mixture after addition of the ammonium salt of formula (II); and isolating the pigment composition;

wherein the thus isolated pigment composition comprises, by weight based on the total content of components having a phthalocyanine core, from 70 to 93%, preferably from 81 to 93%, especially from 81 to 91%, of ε copper phthalocyanine;

from 5 to 18%, especially from 6 to 15%, most preferred from 6 to 12%, of the aminomethyl-substituted phtalocyanine of formula (I) or mixture thereof;

from 2 to 15%, especially from 3 to 12%, most preferred from 3 to 9%, of the ammonium sulfonato phthalocyanine of formula (II) or mixture thereof; and from 0 to 2%, preferably from 0 to 1%, of other phthalocyanine compounds.

$C_3$-$C_{20}$Alkyl and $C_3$-$C_{20}$alkenyl are linear, branched or cyclic.

$C_1$-$C_{20}$Alkyl is, for example, methyl, ethyl, n-propyl, isopropyl, n-butyl, sec-butyl, isobutyl, tert-butyl, 2-methyl-butyl, n-pentyl, 2-pentyl, 3-pentyl, 2,2-dimethylpropyl, n-hexyl, heptyl, n-octyl, 1,1,3,3-tetramethylbutyl, 2-ethylhexyl, nonyl, decyl, undecyl, dodecyl, tridecyl, tetradecyl, pentadecyl, hexadecyl, heptadecyl, octadecyl, nonadecyl, eicosyl, cyclopropyl, cyclopropyl-methyl, cyclobutyl, cyclopentyl, cyclohexyl, cyclohexyl-methyl, trimethylcyclohexyl, thujyl, norbornyl, bornyl, norcaryl, caryl, menthyl, norpinyl, pinyl, 1-adamantyl, 2-adamantyl, 5α-gonyl, 5ξ-pregnyl, (+) 1,3,3-trimethylbicyclo[2.2.1]heptyl(fenchyl) or, where applicable, the optical antipodes thereof.

$C_2$-$C_{20}$Alkenyl is, for example, vinyl, allyl, 2-propen-2-yl, 2-buten-1-yl, 3-buten-1-yl, 1,3-butadien-2-yl, 2-penten-1-yl, 3-penten-2-yl, 2-methyl-1-buten-3-yl, 2-methyl-3-buten-2-yl, 3-methyl-2-buten-1-yl, 1,4-pentadien-3-yl, or any desired isomer of hexenyl, octenyl, nonenyl, decenyl, dodecenyl, tetradecenyl, hexadecenyl, octadecenyl, eicosenyl, heneicosenyl, docosenyl, tetracosenyl, hexadienyl, octadienyl, nonadienyl, decadienyl, dodecadienyl, tetradecadienyl, hexadecadienyl, octadecadienyl, eicosadienyl, 2-cyclobuten-1-yl, 2-cyclopenten-1-yl, 2-cyclohexen-1-yl, 3-cyclohexen-1-yl, 2,4-cyclohexadien-1-yl, 1-p-menthen-8-yl, 4(10)-thujen-10-yl, 2-norbornen-1-yl, 2,5-norbornadien-1-yl, 7,7-dimethyl-2,4-norcaradien-3-yl or camphenyl.

Preferably, the composition obtainable according to the invention comprises from 6 to 20% by weight, most preferably from 9 to 16% by weight, based on the total content of components having a phthalocyanine core, of the aminomethyl-substituted phthalocyanine of formula (I) or mixture thereof plus the ammonium sulfonato phthalocyanine of formula (II) or mixture thereof, and the molar ratio of the aminomethyl-substituted phthalocyanine of formula (I) or mixture thereof to the ammonium sulfonato phthalocyanine of formula (II) or mixture thereof is from 1:1 to 5:1. The ratio of α copper phthalocyanine to ε copper phthalocyanine at the beginning of wet-milling is generally from 1:99 to 99:1, preferably from 1:4 to 20:1, most preferred from 1:1 to 10:1.

There is a synergism between all these components. If the quantities of ε copper phthalocyanine or aminomethyl-substituted phthalocyanine of formula (I) are too low, there will be insufficient conversion into the desired ε crystal form. If the ammonium sulfonato phthalocyanine of formula (II) is added too late or its quantity is too low, the pigment composition has poor rheology, dispersibility and contrast ratio. If the quantity of aminomethyl-substituted phthalocyanine of formula (I) is too high, the conversion rate to the ε-form is low and the viscosity and storage stability become poor. If the quantity of ammonium sulfonato phthalocyanine of formula (II) is too high, the contrast ratio and chroma become poor.

Too much further phthalocyanine components, such as especially phthalocyanine amides and sulfonamides, lead to poorer crystallinity of the ε crystal phase and aggregation of the primary particles.

The wet-milling step can be performed either in an usual milling apparatus, such as for example an agitated media pearl mill (e.g. attritor), or in a kneader. The milling aid can be either an insoluble inert solid material, or a crystalline organic compound or inorganic salt.

It is generally preferable to use insoluble inert solid materials in an usual milling apparatus and crystalline organic compound or inorganic salts in kneaders.

As insoluble inert solid materials there are used, for example in an agitated media pearl mill, grinding elements such as balls of from 0.1 to 1 mm in diameter made from zirconium oxide, mixed zirconium oxide, aluminium oxide, quartz or a metal such as steel, preferably mixed zirconium oxide balls having a diameter of from 0.2 to 0.3 mm.

The agitated media pearl mill is a known apparatus, it being possible to control the specific power density. Though it is possible to reach very high speeds and power specific densities, it is preferable to limit the specific power density to at most 2.0 kJ·s$^{-1}$ per liter of grinding space to avoid too high a heat of friction to develop. The peripheral speed of the agitator should then preferably be from 5 to 12 m·s$^{-1}$. The viscosity plays a rather subordinate role. It is necessary, however, to select a viscosity range that is suitable for the apparatus used, for example from 5·10$^{-2}$ Pa·s to 5 Pa·s, preferably from 10$^{-1}$ Pa·s to 5·10$^{-1}$ Pa·s (at 500 s$^{-1}$). The temperature is advantageously in the range between the freezing point and the boiling point of the organic liquid, preferably from 20 to 180° C., especially from 50 to 130° C. The treatment period in the agitated media pearl mill is usually from 20 to 300 minutes (including dwell time in the storage vessel between individual passes), a longer treatment period having generally no significant effect on the properties of the product. As a result, the risk of overmilling can advantageously be excluded.

Preferably, however, the wet-milling step of the invention is performed in a kneader, using as milling aid a crystalline organic compound or inorganic salt. Judiciously, the crystalline organic compound or inorganic salt is poorly soluble in the organic liquid, for example to an extent ≦100 mg/l at 20° C., preferably ≦10 mg/l at 20° C., and with particular preference is virtually insoluble at 20° C.

On the other hand, the crystalline organic compound or inorganic salt and also the organic liquid are preferably each soluble to the extent of at least 10 g/100 ml in water. Suitable crystalline organic compounds are for example urea, sugars such as glucose, and salts of organic acids such as sodium formate or sodium acetate. Preferably, inorganic salts are used such as for example aluminium sulfate, calcium chloride, potassium chloride, sodium carbonate, sodium bicarbonate, sodium chloride or sodium sulfate, where applicable with or without water of crystallization, particular preference being given to sodium sulfate, potassium chloride or sodium chloride.

For kneading, it is preferred to use a milling aid (especially an inorganic salt) having an average particle size of from 5 to 200 μm, with particular preference a milling aid having an average particle size from 10 to 50 μm.

Particular preference is given to using as the organic liquid for wet-milling an alcohol (including polyalcohols such as glycerol, glycols and polyglycols), an ether (such as $C_1$-$C_8$alkyl ethers of polyetheralcohols), a ketone, an ester, an amide, a sulfone, a sulfoxide, a nitro compound or a mono-, bis- or tris-hydroxy-$C_2$-$C_{12}$alkane compound which is substituted by one or two oxo groups and may be esterified with $C_1$-$C_8$alkylcarbonyl or etherified with $C_1$-$C_8$alkyl on one or more hydroxyl groups, or a mixture thereof.

Preferably, the organic liquid is neutral per se, although acidic or basic impurities in customary small amounts are not disruptive. Illustrative examples of organic liquids, which, however, in no way restrict the invention, are ethylene glycol, propylene glycol, diethylene glycol, dipropylene glycol, triethylene glycol, tripropylene glycol, tetraethylene glycol, tetrapropylene glycol, polyethylene glycol and polypropylene glycol, including mono- and di-$C_1$-$C_4$alkylethers thereof (for example monomethyl, monoethyl, dimethyl or diethyl ethers), dimethylformamide, dimethylacetamide, N-methylpyrrolidone, ethyl methyl ketone, cyclohexanone, diacetone alcohol, butyl acetate, n-propylalcohol, isopropylalcohol, n-butylalcohol, isobutylalcohol, triacetin, nitromethane, dimethyl sulfoxide and sulfolane. The organic liquids may optionally be halogenated, for example through Cl or F, such as 2,2,3,3-tetrafluoro-1-propanol or 2,2,2-trifluoroethanol.

With preference, the temperature during kneading is from 10 to 180° C., especially from 20 to 150° C., most preferably from 60 to 130° C. The rotary speed should be set, taking into account the cooling where appropriate, in such a way that the kneaded mass is moved homogeneously under uniform shear and the temperature does not exceed the temperature range of the invention. Instances of local overheating or excessive mechanical stress should as far as possible be avoided. The kneading time is generally from 1 to 200 h In the course of kneading, preferably the ratio of organic liquid to crystalline organic compound or inorganic salt is from 3 ml:7 g to 1 ml:6 g, the ratio of organic liquid to the total weight of the crystalline organic compound or inorganic salt and components having a phthalocyanine core is from 1 ml:2.5 g to 1 ml:7.5 g, and the weight ratio of components having a phthalocyanine core to crystalline organic compound or inorganic salt is from 1:3 to 1:20, especially 1:4 to 1:10.

As the components having a phthalocyanine core are not soluble in the liquid used for wet-milling, their respective quantities in the composition do not change during the process of the invention, with the exception that upon wet-milling, the α copper phthalocyanine is converted into copper phthalocyanine, preferably to an extent of from 97 to 100%.

For the wet-milling step, it is preferable to use as starting materials acid-pasted α copper phthalocyanine and aminomethyl-substituted phthalocyanine of formula (I), as well as finely divided ε copper phthalocyanine. With particular preference, α copper phthalocyanine which has been acid-pasted together with the aminomethyl-substituted phthalocyanine of formula (I) and ε copper phthalocyanine which has been wet-milled are used as starting materials. The ε copper phthalocyanine composition obtainable according to the invention can also be used as a starting material, or ε copper phthalocyanine can be wet-milled alone or with ammonium sulfonato phthalocyanine of formula (II). The most preferred wet-milling method for the ε copper phthalocyanine to be used as starting material is salt-kneading similarly to the process of the invention.

Adequately, the ammonium sulfonato phthalocyanine of formula (II) is added at any stage of wet-milling prior to isolation of the composition of the invention, for example before, during (that is, at any time from the start to the end of wet-milling) or after wet-milling. However, preferably from 1 to 100%, especially from 5 to 100%, with particular preference from 30 to 100% of the ammonium sulfonato phthalocyanine of formula (II) is added before the end of wet-milling, most preferred before or before the end phase (about last 2 hours) of wet-milling.

Instead of the pure monosulfonato phthalocyanine salt, it is also possible to use salts of partially sulfonated phthalocyanines having statistically from 0.5 to 1.5 sulfo groups on the phthalocyanine core. In this case, the quantity of sulfonato phthalocyanine ammonium has to be calculated to be molar equivalent to the theoretical amount of pure monosulfonato phthalocyanine salt, based on the amount of sulfonato groups.

After kneading, the milling aid and the organic liquid are removed from the composition of the invention, for example by filtration. It is preferred to wash out the crystalline organic compound or inorganic salt and the organic liquid with water, especially demineralized water, which water is preferably added in part before filtration for better dissolution. The water may optionally contain acid or bases, especially mineral acids or inorganic bases, preferably alkali metal hydroxides. Washing with further water, especially demineralized water, ensures a low conductivity. Drying of the moist presscake is conducted for example at from −20 to 150° C./$10^{-1}$ to $10^5$ Pa.

The new composition is also an object of the invention. Hence, the invention also pertains to a pigment composition comprising, by weight based on the total content of components having a phthalocyanine core, from 70 to 93%, preferably from 81 to 93%, especially from 81 to 91%, of ε copper phthalocyanine;

from 5 to 18%, especially from 6 to 15%, most preferred from 6 to 12%, of the aminomethyl-substituted phthalocyanine of formula (I) or mixture thereof;

from 2 to 15%, especially from 3 to 12%, most preferred from 3 to 9%, of the ammonium sulfonato phthalocyanine of formula (II) or mixture thereof; and from 0 to 2%, preferably from 0 to 1%, of other phthalocyanine compounds.

The phthalocyanine pigment composition of the invention has preferably a specific surface area of from 50 to 110 m²/g, more preferred from 80 to 110 m²/g, most preferred from 85 to 100 m²/g, as determined by the BET method. Due to the presence of phthalocyanine derivatives, the measured specific surface area of the composition is often much lower than that of the phthalocyanine pigment comprised therein. The average particle size is preferably about from 20 to 60 nm, most preferred about from 30 to 50 nm, as determined on electron microscopy pictures.

The phthalocyanine pigment composition of the invention can be used for any known colouring purpose, for example as pigment for color filters, printing inks, toners, plastics and coatings.

High molecular weight organic materials to be pigmented with the phthalocyanine pigment composition of the invention are of natural or synthetic origin (for example polymers) and have usually a molecular weight usually in the range from $10^3$ to $10^8$ g/mol. They can be in the form of fibres, surface-coating compositions (including special-effect finishes, including those for the automotive sector) and printing inks, or preferably also in so-called resists (for example for color filters) or as toners. Such and further known uses of colourants will be so obvious to the person skilled in the art that it is possible to dispense with describing them here in more detail. They are also disclosed in numerous patent specifications and technical works, for example "Industrielle Organische Pigmente" (W. Herbst+K. Hunger, VCH Weinheim/New York, new editions continually published in German and English).

The total amount of phthalocyanine pigment composition of the invention is adequately from 0.01 to 70% by weight, based on the total weight of colourants and high molecular weight organic material.

The phthalocyanine pigment composition of the invention can be used for making color filters as the only colourant of the blue layer, as well as in combination with customary other colourants (pigments or dyes) either in the same blue layer, or in different layers of the color filter.

Pigments useful in combination with the phthalocyanine pigment composition of the invention are, for example, Color Index Pigment Yellow 3, 12, 13, 14, 17, 24, 34, 42, 53, 62, 74, 83, 93, 95, 108, 109, 110, 111, 119, 123, 128, 129, 139, 147, 150, 164, 168, 173, 174, 184, 188, 191, 191:1, 191:2, 193, 199, Pigment Orange 5, 13, 16, 34, 40, 43, 48, 49, 51, 61, 64, 71, 73, Pigment Red 2, 4, 5, 23, 48:1, 48:2, 48:3, 48:4, 52:2, 53:1, 57, 57:1, 88, 89, 101, 104, 112, 122, 144, 146, 149, 166, 168, 177, 178, 179, 181, 184, 190, 192, 194, 202, 204, 206, 207, 209, 214, 216, 220, 221, 222, 224, 226, 254, 255, 262, 264, 270, 272, 282, 283, Pigment Brown 23, 24, 33, 42, 43, 44, Pigment Violet 1, 19, 23, 27, 29, 30, 31, 32, 37, 40, 42 or 50, Pigment Blue 15, 15:1, 15:2, 15:3, 15:4, 16, 28, 29, 60, 64, 66, Pigment Green 7, 17, 36, 37, 50, Pigment White 6, Pigment Black 7, 12, 27, 30, 31, 32, Vat Red 74, 3,6-di(3'-cyanophenyl)-2,5-dihydro-pyrrolo[3,4-c]pyrrole-1,4-dione or 3-phenyl-6-(4'-tert-butyl-phenyl)-2,5-dihydro-pyrrolo[3,4-c]pyrrole-1,4-dione.

Especially useful in the same layer or an adjacent blue layer of color filters are dioxazines (such as C. I. Pigment Violet 23), quinacridones (such as C. I. Pigment Violet 19), aminoanthraquinones (such as C. I. Pigment Red 144) or diketopyrrolopyrroles (such as C. I. Pigment Red 254).

Dyes useful in combination with the phthalocyanine pigment composition of the invention, particularly synergistically in the same layer of color filters, are preferably the anthraquinone colourants disclosed in PCT/EP07/051 154.

The invention further pertains to a composition comprising from 0.1 to 70% by weight of the phthalocyanine pigment composition of the invention and a liquid medium comprising a binder or a polymerisable compound.

The invention finally pertains to a process for manufacturing a color filter, wherein a composition comprising from 0.1 to 70% by weight of the phthalocyanine pigment composition of the invention and a liquid medium comprising a binder or a polymerisable compound is applied onto a transparent substrate optionally comprising patterned or not patterned layers thereon, and the composition is dried and/or cured to give a patterned or not patterned layer.

The drying, patterning and curing processes are well-known in the art, but are nevertheless described below in more detail for illustration purpose.

The invention in particular also pertains to the use of the phthalocyanine pigment compositions of the invention in color filters, which can themselves be used for example in electro-optical systems such as TV screens, computer screens, portable telephone screens, navigation systems, CCD cameras, liquid crystal displays, flat panel displays, charge coupled devices, plasma displays and electroluminescent displays, or the like. These may be, for example, active (twisted nematic) or passive (supertwisted nematic) ferro-electric displays or light-emitting diodes.

The compositions according to the invention exhibit in particular an improved better rheology. The color filters manufactured according to the invention exhibit outstanding hue, light stability, transparency and contrast, as well as in particular an improved contrast ratio, as compared with previous technology.

The phthalocyanine pigment composition of the invention will generally be used in the manufacture of color filters as a solution or dispersion in an organic solvent or water. There are several ways to manufacture these color filters, which follow two mainstreams:

Direct patterning during applying;

Patterning after applying the colourant.

Direct patterning can be obtained by several printing techniques, such as impact (off-set, flexography, stamping, letterpress etc.) as well as non-impact (ink jet techniques).

Other direct patterning techniques are based on lamination processes, electronic discharging processes like electrodeposition and some special color proofing methods, like the so-called Chromalin™ process (DuPont).

For impact printing techniques, colourants may be dissolved or dispersed in water or organic solvents by standard deagglomeration methods (Skandex™, Dynomill™, Dispermat™ and the like) in the presence of a dispersant and a polymeric binder to produce an ink. Any dispersion technique known in the field, including the choice of solvent, dispersant and binder, can be used. The type of ink and its viscosity depend on the application technique and are well-known to the skilled artisan. Most usual binders, to which the invention is of course not limited, are (meth)acrylates, epoxies, PVA, polyimids, Novolak systems and the like as well as combinations of these polymers.

The ink dispersion then can be printed on all kind of standard printing machines. Curing of the binder system is preferably achieved by a heating process. The three colors can be applied at once or in different printing steps with intermediate drying and/or curing steps, for example one color at a time in three printing steps.

Inks for use in ink jet, for example piezo or bubble jet, can be prepared likewise. They generally contain a colourant dissolved or dispersed in water and/or one or a mixture of many hydrophilic organic solvents in combination with a dispersant and a binder.

For ink jet printing, a standard ink jet printer can be used or a dedicated printer can be built in order to optimize for example the printing speed etc.

For lamination techniques, like thermal transfer and the like, a web system has to be made: the colourant is dispersed in a solvent or water with dispersant and binder and coated on a foil and dried. The colourant/binder system can be patternwise or uniformly transferred to a color filter substrate with the help of energy (UV, IR, heat, pressure etc.). Depending on the technique used, the colourant for example may be transferred alone (dye diffusion or sublimation transfer), or the colourant dispersion may be entirely transferred including the binder (wax transfer).

For electrodeposition, the colourant has to be dispersed in water together with an ionized polymer. By means of an electrical current, the ionized polymer is deionized at the anode or the cathode and, being insoluble then, deposited together with the pigments. This can be done on patterned or patternwise shielded, by a photoresist, (transparent) photo-conductors like ITO etc.

The Chromalin™ process makes use of a photosensitive material, deposited on a color filter substrate. The material becomes tacky upon UV exposure. The so called 'toner', comprising a mixture or compound of colourant and polymer, is distributed on the substrate and sticks on the tacky parts. This process has to be done three to four times for R, G, B and eventually black.

Patterning after applying is a method based mostly on the known photoresist technology, wherein the colourant is dispersed in the photoresist composition. Other methods are indirect patterning with the help of a separate photoresist or lamination techniques.

The colourant may be dissolved or dispersed into photoresists by any standard method such as described above for the printing processes. The binder systems may also be identical. Further suitable compositions are described for example in EP 0654 711, WO 98/45 756 or WO 98/45 757.

Photoresists comprise a photoinitiator and a poly-crosslinkable monomer (negative radical polymerization), a material to crosslink the polymers itself (for example a photoacid generator or the like) or a material to chemically change the solubility of the polymer in certain developing media. This process, however, can also be done with heat (for example using thermal arrays or a NIR beam) instead of UV, in the case of some polymers which undergo chemical changes upon heating, resulting in changes of solubility in the mentioned developing media. A photoinitiator is then not needed.

The photosensitive or heat sensible material is coated on a color filter substrate, dried and UV (or heat) irradiated, sometimes again baked (photoacid generators) and developed with a developing medium (mostly a base). In this last step only the non-exposed (negative systems) or only the exposed (positive systems) parts are washed away, giving the wanted pattern. This operation has to be repeated for all the colors used.

Photosensitive lamination techniques are using the same principle, the only difference being the coating technique. A photosensitive system is applied as described above, however on a web instead of a color filter substrate. The foil is placed on the color filter substrate and the photosensitive layer is transferred with the help of heat and/or pressure.

Indirect processes, with the above mentioned polymeric binders without a photosensitive component, make use of an extra photoresist, coated on top of the pigmented resist. During the patterning of the photoresist, the colored resist is patterned as well. The photoresist has to be removed afterwards.

More details about the manufacture of color filters can be found in text books, reviews and other scientific articles. The skilled artisan will associate the instant invention with the use of any such known technique as well.

For example, which is of course in no way limitative, substantially colourless methacrylic resin are commonly used in color filters, examples thereof which are known to the skilled artisan being copolymers of aromatic methacrylates with methacrylic acid of $M_w$ from 30,000 to 60,000. Such resins are highly appropriated to make films by spin-coating.

The color filters of the invention contain the phthalocyanine pigment composition of the invention judiciously in a concentration of from 1 to 75% by weight, preferably from 5 to 50% by weight, with particular preference from 25 to 40% by weight, based on the overall weight of the layer comprising said colourant.

The invention therefore likewise provides a color filter comprising a transparent substrate and one layer or multiple layers thereon, at least one layer comprising from 1 to 75% by weight, preferably from 5 to 50% by weight, with particular preference from 25 to 40% by weight, based on the overall weight of the layer comprising said colourant, of a phthalocyanine pigment composition of the invention dispersed in a high molecular mass organic material. The substrate is preferably essentially colourless (T≧95% all over the visible range from 400 to 700 nm).

The instant printing inks or photoresists for making color filters contain the phthalocyanine pigment composition of the invention judiciously in a concentration of from 0.01 to 40% by weight, preferably from 1 to 25% by weight, with particular preference from 5 to 10% by weight, based on the overall weight of the printing ink or photoresist.

The invention therefore likewise provides a composition for making color filters comprising from 0.01 to 40% by weight, preferably from 1 to 25% by weight, with particular preference from 5 to 10% by weight, based on the overall weight of the composition, of a phthalocyanine pigment composition of the invention dispersed therein.

This colourant composition also may additionally contain other colourants of different structure. The additional components will shift the mixture's spectrum hypsochromically or bathochromically depending on their own hue. The skilled artisan will appreciate by himself which colourants can additionally be used, and in which amounts, depending on the desired color.

In certain cases, it is advantageous to use the inventive phthalocyanine pigment compositions in mixture or in combination with other additives such as wetting agents, surfactants, defoamers, antioxidants, UV absorbers, light stabilizers, plasticizers, or general texture improving agents and so forth. Generally such additives can be used in a concentration from about 0.1 to 25 percent, preferably from about 0.2 to 15% and most preferably from about 0.5 to 8%, by weight based on the weight of the phthalocyanine pigment composition.

Further surfactants can be used to help dispersing the phthalocyanine pigment composition of the invention. Cationic, anionic, amphoteric, zwitterionic or neutral nonionic surfactants are very well known to the person skilled in the art. Suitable surfactants include for example anionic surfactants such as alkylbenzene- or alkylnaphthalene-sulfonates, alkylsulfosuccinates or naphthalene formaldehyde sulfonates; cationic surfactants including, for example, quaternary salts such as benzyl tributyl ammonium chloride; or nonionic or amphoteric surfactants such as polyoxyethylene surfactants and alkyl- or amidopropyl betaines, respectively. Most preferred surfactant, which leads to excellent colourant dispersions and especially highly transparent color filters, is EFKA® 3440 (CIBA Specialty Chemicals Inc.).

Suitable texture improving agents are, for example, fatty acids such as stearic acid or behenic acid, and fatty amines such as laurylamine and stearylamine. In addition, fatty alcohols or ethoxylated fatty alcohols, polyols such as aliphatic 1,2-diols or epoxidized soy bean oil, waxes, resin acids and resin acid salts may be used for this purpose.

Suitable UV stabilizers are, for example, the known benzotriazole derivatives known under the trade name TINUVIN® or CIBA® Fast H Liquid an aryl sulfonated benzotriazol, both being products of CIBA Specialty Chemicals Inc.

The phthalocyanine pigment compositions of the invention will prove particularly useful alone or in combination with fine or transparent pigments.

The materials used for manufacturing color filters according to above-mentioned and other processes are well-known in the art.

For example, a binder may be used which is alkali-soluble, preferably a linear organic polymer that is soluble in an organic solvent and developable with a weak alkali aqueous solution. As such binder used in a color filter resist composition, which is soluble in an alkaline aqueous solution and insoluble in water, for example, a homopolymer of a polymerizable compound having one or more acid groups and one or more polymerizable unsaturated bonds in the molecule, or a copolymer of two or more kinds thereof, and a copolymer of one or more polymerizable compounds having one or more unsaturated bonds copolymerizable with these compounds and containing no acid group, can be used. Such compounds can be obtained by copolymerizing one or more kinds of a low molecular compound having one or more acid groups and one or more polymerizable unsaturated bonds in the molecule with one or more polymerizable compounds having one or more unsaturated bonds copolymerizable with these compounds and containing no acid group. Examples of acids groups are a —COOH group, a —SO$_2$NHCO— group, a —SO$_3$H group, a phenolic hydroxy group, a —SO$_2$NH— group, and a —CO—NH—CO— group. Among those, a high molecular compound having a —COOH group is particularly preferred.

Preferably, the organic polymer binder in the color filter resist composition comprises an alkali soluble copolymer comprising, as addition polymerizable monomer units, at least an unsaturated organic acid compound such as acrylic acid, methacrylic acid and the like. It is preferred to use as a further co-monomer for the polymer binder an unsaturated organic acid ester compound such as methyl acrylate, ethyl (meth)acrylate, benzyl (meth)acrylate, styrene and the like to balance properties such as alkaline solubility, adhesion rigidity, chemical resistance etc.

The organic polymer binder can for example be either a random copolymer or a block copolymer, such as described in U.S. Pat. No. 5,368,976.

Polymerizable compounds suitable for the preparation of color filters according to the invention, are also well-known in the art. They may for example have one or more acid group and one or more polymerizable unsaturated bond in the molecule.

Examples of the polymerizable compounds having one or more —COOH groups and one or more polymerizable unsaturated bonds in a molecule are (meth)acrylic acid, 2carboxyethyl (meth)acrylic acid, 2carboxypropyl (meth)acrylic acid, crotonic acid, cinnamic acid, mono[2-(meth)acryloyloxyethyl]succinate, mono[2-(meth)acryloyloxyethyl]adipate, mono[2-(meth)acryloyloxyethyl]phthalate, mono[2-(meth)acryloyloxyethyl]hexahydrophthalate, mono[2-(meth)acryloyloxyethyl]maleate, mono-[2-(meth)acryloyloxypropyl]succinate, mono[2-(meth)acryloyloxypropyl]adipate, mono [2-(meth)acryloyloxypropyl]phthalate, mono[2-(meth)acryloyloxypropyl]hexahydrophthalate, mono[2-(meth)acryloyloxypropyl]maleate, mono[2-(meth)acryloyloxybutyl]succinate, mono[2-(meth)acryloyloxybutyl]adipate, mono-[2-(meth)acryloyloxybutyl]phthalate, mono[2-(meth)acryloyloxybutyl]hexahydrophthalate, mono[2-(meth)acryloyloxybutyl]maleate, 3-(alkylcarbamoyl)acrylic acid, α-chloroacrylic acid, maleic acid, monoesterified maleic acid, fumaric acid, itaconic acid, citraconic acid, mesaconic acid, maleic anhydride, and ω-carboxypolycaprolactone mono(meth)acrylate.

Vinylbenzenesulfonic acid and 2-(meth)acrylamide-2-methylpropanesulfonic acid are examples of the polymerizable compounds having one or more —SO₃H groups and one or more polymerizable unsaturated bonds.

N-methylsulfonyl (meth)acrylamide, N-ethylsulfonyl (meth)acrylamide, N-phenylsulfonyl (meth)acrylamide, and N-(p-methylphenylsulfonyl)(meth)acrylamide are examples of the polymerizable compounds having one or more —SO₂NHCO— groups and one or more polymerizable unsaturated bonds.

Examples of polymerizable compounds having one or more phenolic hydroxy groups and one or more polymerizable unsaturated bonds in a molecule include hydroxyphenyl (meth)acrylamide, dihydroxyphenyl (meth)acrylamide, hydroxyphenyl-carbonyloxyethyl (meth)acrylate, hydroxyphenyloxyethyl (meth)acrylate, Hydroxyphenylthioethyl (meth)acrylate, dihydroxyphenylcarbonyloxyethyl (meth)acrylate, Dihydroxyphenyloxyethyl (meth)acrylate, and dihydroxy-phenylthioethyl (meth)acrylate.

Examples of the polymerizable compound having one or more —SO₂NH— groups and one or more polymerizable unsaturated bonds in the molecule include compounds represented by formula (a) or (b):

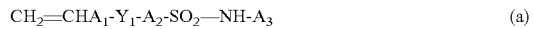  (a)

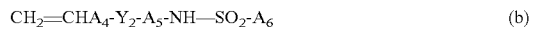  (b)

wherein $Y_1$ and $Y_2$ each represents —COO—, —CONA₇-, or a single bond; $A_1$ and $A_4$ each represents H or CH₃; $A_2$ and $A_5$ each represents $C_1$-$C_{12}$alkylene optionally having a substituent, cycloalkylene, arylene, or aralkylene, or $C_2$-$C_{12}$alkylene into which an ether group and a thioether group are inserted, cycloalkylene, arylene, or aralkylene; $A_3$ and $A_6$ each represents H, $C_1$-$C_{12}$alkyl optionally having a substituent, a cycloalkyl group, an aryl group, or an aralkyl group; and $A_7$ represents H, $C_1$-$C_{12}$alkyl optionally having a substituent, a cycloalkyl group, an aryl group, or an aralkyl group.

The polymerizable compounds having one or more —CO—NH—CO— group and one or more polymerizable unsaturated bond include maleimide and N-acryloyl-acrylamide. These polymerizable compounds become the high molecular compounds comprising a —CO—NH—CO— group, in which a ring is formed together with a primary chain by polymerization. Further, a methacrylic acid derivative and an acrylic acid derivative each having a —CO—NH—CO— group can be used as well. Such methacrylic acid derivatives and the acrylic acid derivatives include, for example, a methacrylamide derivative such as N-acetylmethacrylamide, N-propionylmethacrylamide, N-butanoylmethacrylamide, N-pentanoylmethacrylamide, N-decanoylmethacrylamide, N-dodecanoylmethacrylamide, N-benzoylmethacrylamide, N-(p-methylbenzoyl)methacrylamide, N-(p-chlorobenzoyl)methacrylamide, N-(naphthyl-carbonyl)methacrylamide, N-(phenylacetyl)-methacryl-amide, and 4-methacryloylaminophthalimide, and an acrylamide derivative having the same substituent as these. These polymerizable compounds polymerize to be compounds having a —CO—NH—CO— group in a side chain.

Examples of polymerizable compounds having one or more polymerizable unsaturated bond and containing no acid group include a compound having a polymerizable unsaturated bond, selected from esters of (meth)acrylic acid, such as methyl (meth)acrylate, ethyl (meth)acrylate, propyl (meth)acrylate, butyl (meth)acrylate, tetrahydrofurfuryl (meth)acrylate, benzyl (meth)acrylate, 2ethylhexyl (meth)acrylate, hydroxyethyl (meth)acrylate, hydroxypropyl (meth)acrylate, hydroxybutyl (meth)acrylate, glycerol mono(meth)acrylate, dihydroxypropyl (meth)acrylate, allyl (meth)acrylate, cyclohexyl (meth)acrylate, phenyl (meth)acrylate, methoxyphenyl (meth)acrylate, methoxyethyl (meth)acrylate, phenoxyethyl (meth)acrylate, methoxydiethyleneglycol (meth)acrylate, methoxytriethyleneglycol (meth)acrylate, methoxypropyl (meth)acrylate, methoxydipropyleneglycol (meth)acrylate, isobornyl meth(acrylate), dicyclopentadienyl (meth)acrylate, 2-hydroxy-3phenoxypropyl (meth)acrylate, tricyclo[5.2.1.0²,⁶]decan-8yl (meth)acrylate, aminoethyl (meth)acrylate, N,N-dimethylaminoethyl (meth)acrylate, aminopropyl (meth)acrylate, N,N-dimethylaminopropyl (meth)acrylate, glycidyl (meth)acrylate, 2methylglycidyl (meth)acrylate, 3,4epoxybutyl (meth)acrylate, 6,7epoxyheptyl (meth)acrylate; vinyl aromatic compounds, such as styrene, α-methylstyrene, vinyltoluene, p-chlorostyrene, polychlorostyrene, fluorostyrene, bromostyrene, ethoxymethyl styrene, methoxystyrene, 4-methoxy-3-methylstyrene, dimethoxystyrene, vinylbenzyl methyl ether, vinylbenzyl glycidyl ether, indene, 1-methylindene; vinyl or allyl esters, such as vinyl acetate, vinyl propionate, vinyl butylate, vinyl pivalate, vinyl benzoate, vinyl trimethylacetate, vinyl diethylacetate, vinyl borate, vinyl caproate, vinyl chloroacetate, vinyl dichloroacetate, vinyl methoxyacetate, vinyl butoxyacetate, vinyl phenylacetate, vinyl acetate, vinyl acetoacetate, vinyl lactate, vinyl phenylbutylate, vinyl cyclohexylcarboxylate, vinyl salicylate, vinyl chlorobenzoate, vinyl tetrachlorobenzoate, vinyl naphthoate, allyl acetate, allyl propionate, allyl butylate, allyl pivalate, allyl benzoate, allyl caproate, allyl stearate, allyl acetoacetate, allyl lactate; vinyl or allyl ethers, such as vinyl methyl ether, vinyl ethyl ether, vinyl hexyl ether, vinyl octyl ether, vinyl ethylhexyl ether, vinyl methoxyethyl ether, vinyl ethoxyethyl ether, vinyl chloroethyl ether, vinyl hydroxyethyl ether, vinyl ethylbutyl ether, vinyl hydroxyethoxyethyl ether, vinyl dimethylaminoethyl ether, vinyl diethylaminoethyl ether, vinyl butylaminoethyl ether, vinyl benzyl ether, vinyl tetrahydrofurfuryl ether, vinyl phenyl ether, vinyl tolyl ether, vinyl chlorophenyl ether, vinyl chloroethyl ether, vinyl dichlorophenyl ether, vinyl naphthyl ether, vinyl anthryl ether, allyl glycidyl ether; amide type unsaturated compounds, such as (meth)acrylamide, N,N-dimethyl (meth)acrylamide, N,N-diethyl (meth)acrylamide, N,N-dibutyl (meth)acrylamide, N,N-diethylhexyl (meth)acrylamide, N,N-dicyclohexyl (meth)acrylamide, N,N-diphenyl (meth)acrylamide, N-methyl-N-phenyl (meth)acrylamide, N-hydroxyethyl-N-methyl (meth)acrylamide, N-methyl (meth)acrylamide, N-ethyl (meth)acrylamide, N-propyl (meth)acrylamide, N-butyl (meth)acrylamide, N-hydroxyethyl (meth)acrylamide, N-heptyl (meth)acrylamide, N-octyl (meth)acrylamide, N-ethyhexyl (meth)acrylamide, N-hydroxyethyl (meth)acrylamidecyclohexyl, N-benzyl (meth)acrylamide, N-phenyl (meth)acrylamide, N-tolyl (meth)acrylamide, N-hydroxyphenyl (meth)acrylamide, N-naphthyl (meth)acrylamide, N-phenylsulfonyl (meth)acrylamide, N-methylphenylsulfonyl (meth)acrylamide and N-(meth)acryloylmorpholine, diacetone acrylamide, N-methylol acrylamide, N-butoxyacrylamide; polyolefin type compounds, such as butadiene, isoprene, chloroprene and the like; (meth)acrylonitrile, methyl isopropenyl ketone, maleimide, N-phenylmaleimide, N-methylphenylmaleimide, N-methoxyphenylmaleimide, N-cyclohexylmaleimide, N-alkylmaleimide, maleic anhydride, polystyrene macromonomer, polymethyl (meth)acrylate macromonomer, polybutyl (meth)acrylate macromonomer; crotonates, such as butyl crotonate, hexyl crotonate, glycerine monocrotonate; and itaconates, such as dimethyl itaconate, diethyl itaconate, dibutyl itaconate; and maleates or fumarates, such as dimethyl maleate, dibutyl fumarate.

Preferable examples of copolymers are copolymers of methyl (meth)acrylate and (meth)acrylic acid, copolymers of benzyl (meth)acrylate and (meth)acrylic acid, copolymers of methyl (meth)acrylate/, ethyl (meth)acrylate and (meth) acrylic acid, copolymers of benzyl (meth)acrylate, (meth) acrylic acid and styrene, copolymers of benzyl (meth)acrylate, (meth)acrylic acid and 2hydroxyethyl (meth)acrylate, copolymers of methyl (meth)acrylate/, butyl (meth)acrylate, (meth)acrylic acid and styrene, copolymers of methyl (meth) acrylate, benzyl (meth)acrylate, (metha)crylic acid and hydroxyphenyl (meth)acrylate, copolymers of methyl(meth) acrylate, (metha)crylic acid and polymethyl (meth)acrylate macromonomer, copolymers of Benzyl (meth)crylate, (metha)crylic acid and polymethyl (meth)acrylate macromonomer, copolymers of tetrahydrofurfuryl (meth)acrylate, styrene and (meth)acrylic acid, copolymers of methyl (meth)acrylate, (meth)acrylic acid and polystyrene macromonomer, copolymers of benzyl (meth)acrylate, (meth)acrylic acid and polystyrene macromonomer, copolymers of benzyl (meth)acrylate, (meth)acrylic acid, 2hydroxyethyl (meth)acrylate and polystyrene macromonomer, copolymers of benzyl (meth) acrylate, (meth)acrylic acid, 2-hydroxypropyl (meth)acrylate and polystyrene macromonomer, copolymers of benzyl (meth)acrylate, (meth)acrylic acid, 2-hydroxy-3phenoxypropyl (meth)acrylate and polymethyl (meth)acrylate macromonomer, copolymers of methyl (meth)acrylate, (meth) acrylic acid, 2hydroxyethyl (meth)acrylate and polystyrene macromonomer, copolymers of benzyl (meth)acrylate, (metha)crylic acid, 2hydroxyethyl (meth)acrylate and polymethyl (meth)acrylate macromonomer, copolymers of N-phenylmaleimide, benzyl (meth)acrylate, (metha)crylic acid and styrene, copolymers of benzyl (meth)acrylate, (meth)acrylic acid, N-phenylmaleimide, mono-[2-(meth) acryloyloxyethyl]succinate and styrene, copolymers of allyl (meth)acrylate, (meth)acrylic acid, N-phenylmaleimide, mono-[2-(meth)acryloyloxyethyl]succinate and styrene, copolymers of benzyl (meth)acrylate, (meth)acrylic acid, N-phenylmaleimide, glycerol mono(meth)acrylate and styrene, copolymers of benzyl (meth)acrylate, carboxypolycaprolactone mono(meth)acrylate, (meth)acrylic acid, N-phenylmaleimide, glycerol mono(meth)acrylate and styrene, and copolymers of benzyl (meth)acrylate, (meth)acrylic acid, N-cyclohexylmaleimide and styrene.

There can be used as well hydroxystyrene homo- or co-polymers or a novolak type phenol resin, for example, poly (hydroxystyrene) and poly(hydroxystyrene-co-vinylcyclohexanol), a novolak resin, a cresol novolak resin, and a halogenated phenol novolak resin. More specifically, it includes, for example, the methacrylic acid copolymers, the acrylic acid copolymers, the itaconic acid copolymers, the crotonic acid copolymers, the maleic anhydride co-polymers, for example, with styrene as a co-monomer, and maleic acid copolymers, and partially esterified maleic acid copolymers each described in, for example, JP-B-S59/44 615, JP-B-S54/34 327, JP-B-S58/12 577, JP-B-S54/25 957, JP-A-S59/53 836, JP-A-S59/71 048, JP-A-S60/159 743, JP-A-S60/258 539, JP-A-H01/152 449, JP-A-H02/199 403 and JP-A-H02/199 404, and which copolymers can be further reacted with an amine, as e.g. disclosed in U.S. Pat. No. 5,650,263; further, a cellulose derivative having a carboxyl group on a side chain can be used, and particularly preferred are copolymers of benzyl (meth)acrylate and (meth)acrylic acid and copolymers of benzyl (meth)acrylate, (meth)acrylic acid and other monomers, for example as described in U.S. Pat. No. 4,139,391, JP-B-S59/44 615, JP-A-S60/159 743 and JP-A-S60/258 539.

With respect to those having carboxylic acid groups among the above organic binder polymers, it is possible to react some or all of the carboxylic acid groups with glycidyl (meth) acrylate or an epoxy (meth)acrylate to obtain photopolymerizable organic binder polymers for the purpose of improving the photosensitivity, coating film strength, the coating solvent and chemical resistance and the adhesion to the substrate. Examples are disclosed in JP-B-S50/34 443 and JP-B-S50/34 444, U.S. Pat. Nos. 5,153,095, 5,650,233 and 5,677,385, as well as by T. Kudo et al. in J. Appl. Phys., Vol. 37 (1998), p. 3594-3603. The entire contents of all above-mentioned patents and patent applications is enclosed herein by reference.

Among these various kinds of alkali-soluble binders, acrylic acid homo- and copolymers as well as methacrylic acid homo- and copolymers are particularly preferred.

The weight-average molecular weight of the binders is preferably from 500 to 1,000,000, e.g. from 3,000 to 1,000,000, more preferably from 5,000 to 400,000.

The content of an alkali-soluble binder in the dye-containing curable resin composition is preferably from 10 to 90% by weight, more preferably from 20 to 80% by weight, and particularly preferably from 30 to 70% by weight, based on the total solid content of the dye-containing curable resin composition.

Photopolymerisable vinyl compounds are also well known to the person skilled in the art. These monomers contain at least one ethylenic double bond and usually have a boiling point of 100° C. or more.

Examples of suitable photopolymerisable vinyl compounds are polyethylene glycol monoacrylate, polyethylene glycol monomethacrylate, polypropylene glycol monoacrylate, polypropylene glycol monomethacrylate, phenoxyethyl acrylate, phenoxyethyl methacrylate, polyethylene glycol diacrylate, polyethylene glycol dimethacrylate, trimethylolpropane triacrylate, trimethylolpropane triamethacrylate, neopentylglycol diacrylate, neopentylglycol dimethacrylate, pentaerythritol triacrylate, pentaerythritol triamethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, tri(acryloyloxyethyl)isocyanurate. Preferred photopolymerisable vinyl compounds are dipentaerythritol pentaacrylate and dipentaerythritol pentamethacrylate.

The total content of such a photopolymerisable vinyl compound in a colourant-containing curable composition is, while it varies depending on the material thereof, generally from 5 to 70% by weight, preferably from 5 to 50% by weight, and particularly preferably from 7 to 30% by weight, based on the solid content of the composition.

Suitable photoinitiators are also well-known to the person skilled in the art and are preferably selected from halomethyloxadiazols, halomethyl-s-triazines, 3-aryl-substituted coumarins, benzophenones, acetophenones, cyclopentadienebenzene-iron complexes, oxime esters and oximes.

Suitable photoinitiators are described, for example, in GB-2,339,571, U.S. Pat. No. 6,485,885, GB-2,358,017, GB-2,357,293, WO-02/100 903, J. Photopolym. Sci. Technol. 15, 51-57 (2002), IP. com. Journal IPCOM 000012462D, 3(6), 101-109 (2003), US-2004/0 102 548, US-2004/0 102 673, PCT/EP2006/068 202 and PCT/EP2006/068 254.

Preferred photoinitiators are benzophenones of the formula

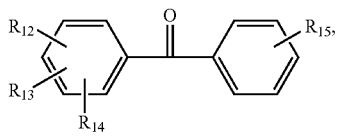

wherein $R_{12}$, $R_{13}$ and $R_{14}$ independently of one another are hydrogen, $C_1$-$C_4$-alkyl, $C_1$-$C_4$-halogenalkyl, $C_1$-$C_4$-alkoxy, chlorine or $N(C_1$-$C_4$-alkyl$)_2$; $R_{15}$ is hydrogen, $C_1$-$C_4$-alkyl, $C_1$-$C_4$-halogenalkyl, phenyl, $N(C_1$-$C_4$-alkyl$)_2$, $COOCH_3$,

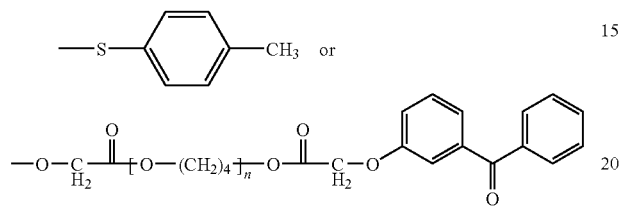

and n is 2-10.

Specific examples are ESACURE TZT® available from Lamberti, (a mixture of 2,4,6-trimethylbenzophenone and 4-methylbenzophenone) and DAROCUR® BP (benzophenone).

Further preferred photoinitiators are alpha-hydroxy ketones, alpha-alkoxyketones or alpha-aminoketones of the formula

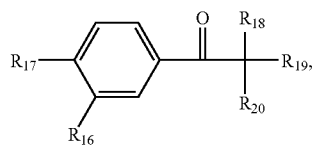

wherein $R_{16}$ is hydrogen or $C_1$-$C_{18}$-alkoxy; $R_{17}$ is hydrogen, $C_1$-$C_{18}$-alkyl, $C_1$-$C_{12}$hydroxyalkyl, $C_1$-$C_{18}$-alkoxy, —OCH$_2$CH$_2$—OR$_{21}$, morpholino, $C_1$-$C_{18}$alkyl-S—, a group $H_2C$=CH—, $H_2C$=C(CH$_3$)—,

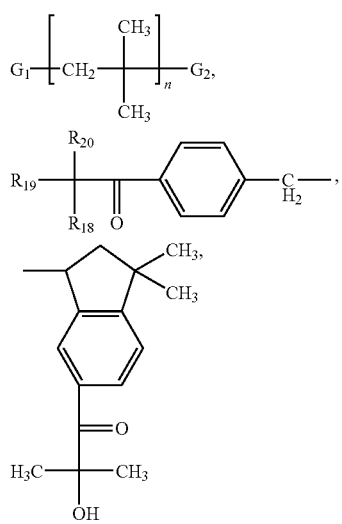

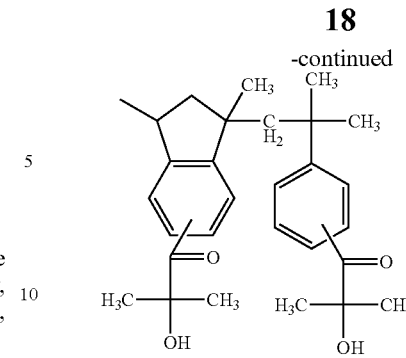

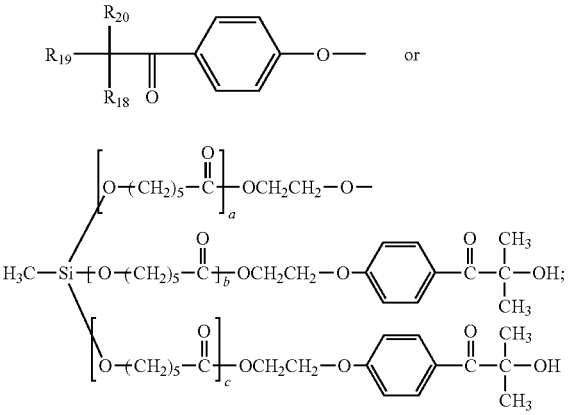

a, b and c are 1-3; n is 2-10; $G_1$ and $G_2$ independently of one another are end groups of the polymeric structure, preferably hydrogen or methyl; $R_{18}$ is hydroxy, $C_1$-$C_{16}$-alkoxy, morpholino, dimethylamino or —O(CH$_2$CH$_2$O)$_m$—C$_1$-$C_{16}$-alkyl; $R_{19}$ and $R_{20}$ independently of one another are hydrogen, $C_1$-$C_6$-alkyl, $C_1$-$C_{16}$-alkoxy or —O(CH$_2$CH$_2$O)$_m$—C$_1$-$C_{16}$-alkyl; or unsubstituted phenyl or benzyl; or phenyl or benzyl substituted by $C_1$-$C_{12}$-alkyl; or $R_{19}$ and $R_{20}$ together with the carbon atom to which they are attached form a cyclohexyl ring; m is 1-20; with the proviso that $R_{18}$, $R_{19}$ and $R_{20}$ are not all together $C_1$-$C_{16}$-alkoxy or —O(CH$_2$CH$_2$O)$_m$-$C_1$-$C_{16}$-alkyl; and $R_{21}$ is hydrogen,

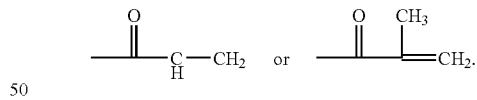

Specific examples are 1-hydroxy-cyclohexyl-phenyl-ketone, a mixture of 1-hydroxycyclohexyl-phenyl-ketone with benzophenone, 2-methyl-1[4-(methylthio)phenyl]-2-morpholinopropan-1-one, 2-benzyl-2-dimethylamino-1-(4-morpholinophenyl)butanone-1,2-dimethylamino-2-(4-methylbenzyl)-1-(4-morpholin-4-yl-phenyl)butan-1-one, 1-[4-(2-hydroxyethoxy)-phenyl]-2-hydroxy-2-methyl-1-propan-1-one, 2,2-dimethoxy-1,2-diphenylethan-1-one, 2-hydroxy-2-methyl-1-phenyl-propan-1-one, 2-hydroxy-1-{4-[4-(2-hydroxy-2-methyl-propionyl)-benzyl]-phenyl}-2-methylpropan-1-one, 2-benzyl-1-(3,4-dimethoxy-phenyl)-2-dimethylamino-butan-1-one, 2-hydroxy-1-{4-[4-(2-hydroxy-2-methyl-propionyl)-phenoxy]-phenyl}-2-methylpropan-1-one,

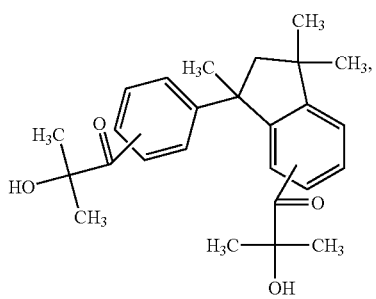

ESACURE® KIP provided by Fratelli Lamberti and 2-hydroxy-1-{1-[4-(2-hydroxy-2-methyl-propionyl)-phenyl]-1,3,3-trimethyl-indan-5-yl}-2-methyl-propan-1-one.

Further preferred photoinitiators are acylphosphine oxides of the formula

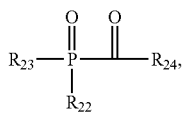

wherein $R_{22}$ and $R_{23}$ independently of one another are unsubstituted $C_1$-$C_{20}$-alkyl, cyclohexyl, cyclopentyl, phenyl, naphthyl or biphenylyl; or $C_1$-$C_{20}$-alkyl, cyclohexyl, cyclopentyl, phenyl, naphthyl or biphenylyl substituted by halogen, $C_1$-$C_{12}$-alkyl, $C_1$-$C_{12}$-alkoxy, $C_1$-$C_{12}$alkylthio or $NR_{25}R_{26}$, or $R_{22}$ and $R_{23}$ are independently of one another —(CO)$R_{24}$; $R_{25}$ and $R_{26}$ independently of one another are hydrogen, unsubstituted $C_1$-$C_{12}$-alkyl or $C_1$-$C_{12}$-alkyl substituted by OH or SH wherein the alkyl chain may be interrupted by one to four oxygen atoms; or $R_{25}$ and $R_{26}$ independently of one another are $C_2$-$C_{12}$-alkenyl, cyclopentyl, cyclohexyl, benzyl or phenyl; $R_{24}$ is unsubstituted cyclohexyl, cyclopentyl, phenyl, naphthyl or biphenylyl, or cyclohexyl, cyclopentyl, phenyl, naphthyl or biphenylyl substituted by halogen, $C_1$-$C_4$-alkyl and/or $C_1$-$C_4$-alkoxy; or $R_{24}$ is a 5- or 6-membered heterocyclic ring having an S atom or N atom. Specific examples thereof are bis(2,4,6-trimethylbenzoyl)-phenylphosphine oxide, bis(2,4,6-trimethylbenzoyl)-phenylethoxyphosphine oxide, 2,4,6-trimethylbenzoyl-diphenylphosphine oxide and bis(2,6-dimethoxybenzoyl)-2,4,4-trimethylpentylphosphine oxide.

Further preferred photoinitiators are titanocenes of the formula

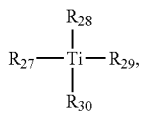

wherein $R_{27}$ and $R_{28}$ independently of one another are cyclopentadienyl optionally mono-, di-, or tri-substituted by $C_1$-$C_{18}$-alkyl, $C_1$-$C_{18}$-alkoxy, cyclopentyl, cyclohexyl or halogen; $R_{29}$ and $R_{30}$ are phenyl having at least one F or $CF_3$ substituent in ortho position to the Ti—C bond and having at least a further substituent which is unsubstituted pyrrolinyl or polyoxaalkyl or which is pyrrolinyl or polyoxaalkyl substituted by one or two $C_1$-$C_{12}$-alkyl, di($C_1$-$C_{12}$-alkyl)aminomethyl, morpholinomethyl, $C_2$-$C_4$-alkenyl, methoxymethyl, ethoxymethyl, trimethylsilyl, formyl, methoxy or phenyl; or $R_{29}$ and $R_{30}$ are

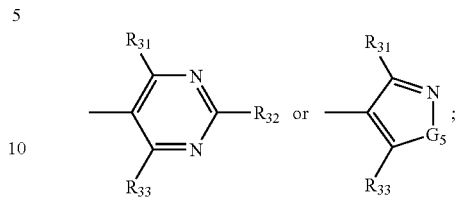

$G_5$ is O, S, or $NR_{34}$; $R_{31}$, $R_{32}$ and $R_{33}$ independently of one another are hydrogen, halogen, $C_2$-$C_{12}$-alkenyl, $C_1$-$C_{12}$alkoxy, $C_2$-$C_{12}$-alkoxy interrupted by one to four oxygen atoms, cyclohexyloxy, cyclopentyloxy, phenoxy, benzyloxy, unsubstituted phenyl or biphenyl or phenyl or biphenyl substituted by $C_1$-$C_4$-alkoxy, halogen, phenylthio or $C_1$-$C_4$-alkylthio, with the proviso that $R_{31}$ and $R_{33}$ are not both hydrogen and that, with respect to the residue

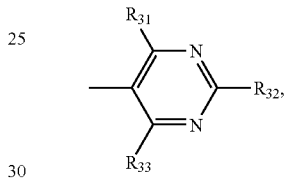

at least one substituent $R_{31}$ or $R_{33}$ is $C_1$-$C_{12}$alkoxy or $C_1$-$C_{12}$alkoxy interrupted by one to four oxygen atoms, cyclohexyloxy, cyclopentyloxy, phenoxy or benzyloxy; and $R_{34}$ is $C_1$-$C_8$alkyl, phenyl or cyclophenyl. Specific examples thereof are bis(η5-2,4-cyclopentadien-1-yl)bis(2,6-difluoro-3-(1H-pyrrol-1-yl)-phenyl)-titanium and bis(2,6-difluorophenyl)bis[(1,2,3,4,5-η)-1-methyl-2,4-cyclopentadien-1-yl]-titanium.

Further preferred photoinitiators are phenylglyoxalates of the formula

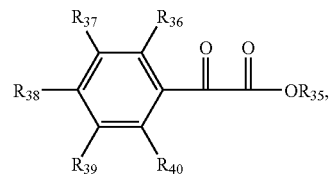

wherein $R_{35}$ is H, $C_1$-$C_{12}$-alkyl or

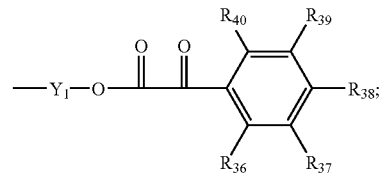

$R_{36}$, $R_{37}$, $R_{38}$, $R_{39}$ and $R_{40}$ independently of one another are hydrogen, unsubstituted $C_1$-$C_{12}$-alkyl or $C_1$-$C_{12}$-alkyl substituted by OH, $C_1$-$C_4$-alkoxy, phenyl, naphthyl, halogen or CN; wherein the alkyl chain optionally is interrupted by one or more oxygen atoms; or $R_{36}$, $R_{37}$, $R_{38}$, $R_{39}$ and $R_{40}$ independently of one another are $C_1$-$C_4$-alkoxy, $C_1$-$C_4$-alkylthio or $NR_{25}R_{26}$; $R_{25}$ and $R_{26}$ independently of one another are hydrogen, unsubstituted $C_1$-$C_{12}$-alkyl or $C_1$-$C_{12}$-alkyl substituted by OH or SH wherein the alkyl chain optionally is interrupted by one to four oxygen atoms; or $R_{25}$ and $R_{26}$ independently of one another are $C_2$-$C_{12}$-alkenyl, cyclopentyl, cyclohexyl, benzyl or phenyl; and $Y_1$ is $C_1$-$C_{12}$-alkylene optionally interrupted by one or more oxygen atoms. A specific example thereof is oxo-phenyl-acetic acid 2-[2-(2-oxo-2-phenyl-acetoxy)-ethoxy]-ethyl ester.

Further preferred photoinitiators are oxime esters of the formula

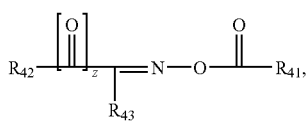

wherein z is 0 or 1; $R_{41}$ is hydrogen, $C_3$-$C_8$cycloalkyl; $C_1$-$C_{12}$alkyl which is unsubstituted or substituted by one or more halogen, phenyl and/or CN; or $R_{41}$ is $C_2$-$C_5$alkenyl; phenyl which is unsubstituted or substituted by one or more $C_1$-$C_6$alkyl, halogen, CN, $OR_{44}$, $SR_{45}$ and/or $NR_{46}R_{47}$; or $R_{41}$ is $C_1$-$C_8$-alkoxy, benzyloxy; or phenoxy which is unsubstituted or substituted by one or more $C_1$-$C_6$alkyl and/or halogen; $R_{42}$ is phenyl, naphthyl, benzoyl or naphthoyl, each of which is substituted 1 to 7 times by halogen, $C_1$-$C_{12}$alkyl, $C_3$-$C_8$cycloalkyl, benzyl, phenoxycarbonyl, $C_2$-$C_{12}$alkoxycarbonyl, $OR_{44}$, $SR_{48}$ $SOR_{45}$, $SO_2R_{45}$ and/or $NR_{46}R_{47}$, wherein the substituents $OR_{44}$, $SR_{45}$ and $NR_{46}R_{47}$ optionally form 5- or 6-membered rings via the radicals $R_{44}$, $R_{45}$, $R_{46}$ and/or $R_{47}$ with further substituents on the phenyl or naphthyl ring; or each of which is substituted by phenyl or by phenyl which is substituted by one or more $OR_{44}$, $SR_{45}$ and/or $NR_{46}R_{47}$; or $R_{42}$ is thioxanthylor

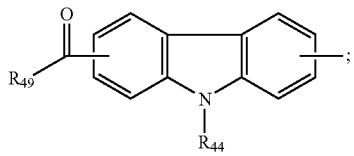

$R_{43}$ is hydrogen; unsubstituted $C_1$-$C_{20}$alkyl or $C_1$-$C_{20}$alkyl substituted by one or more halogen, $OR_{44}$, phenyl; or is $C_3$-$C_8$cycloalkyl; phenyl which is unsubstituted or substituted by one or more $C_1$-$C_6$alkyl, phenyl, halogen, $OR_{44}$, $SR_{45}$ and/or $NR_{46}R_{47}$; or is $C_2$-$C_{20}$alkanoyl or benzoyl which is unsubstituted or substituted by one or more $C_1$-$C_6$alkyl, phenyl, $OR_{44}$, $SR_{45}$ and/or $NR_{46}R_{47}$; or is $C_2$-$C_{12}$alkoxycarbonyl, phenoxycarbonyl, CN, —$CONR_{46}R_{47}$, $NO_2$, $C_1$-$C_4$haloalkyl, $S(O)_y$—$C_1$-$C_6$alkyl or $S(O)_y$-phenyl; y is 1 or 2; $R_{44}$ and $R_{4s}$ independently of one another are hydrogen, $C_1$-$C_{20}$alkyl, $C_2$-$C_{12}$alkenyl, $C_3$-$C_8$cycloalkyl, phenyl-$C_1$-$C_3$alkyl; or are $C_1$-$C_8$alkyl which is substituted by —OH, —SH, —CN, $C_1$-$C_8$alkanoyl, benzoyl, which is unsubstituted or substituted by one or more $C_1$-$C_6$alkyl, halogen, —OH, $C_1$-$C_4$alkoxy or $C_1$-$C_4$alkylsulfanyl; or are phenyl or naphthyl, each of which is unsubstituted or substituted by halogen, $C_1$-$C_{12}$alkyl, $C_1$-$C_{12}$alkoxy, phenyl-$C_1$-$C_3$alkyloxy, phenoxy, $C_1$-$C_{12}$alkylsulfanyl, phenylsulfanyl, —N($C_1$-$C_{12}$alkyl)$_2$, diphenylamino; $R_{46}$ and $R_{47}$ independently of one another are independently of each other are hydrogen, $C_1$-$C_{20}$alkyl, $C_2$-$C_4$hydroxyalkyl, $C_2$-$C_{10}$alkoxyalkyl, $C_2$-$C_5$alkenyl, $C_3$-$C_8$cycloalkyl, phenyl-$C_1$-$C_3$alkyl, $C_1$-$C_8$alkanoyl, $C_3$-$C_{12}$alkenoyl, benzoyl; or are phenyl or naphthyl, each of which is unsubstituted or substituted by $C_1$-$C_{12}$alkyl, benzoyl or $C_1$-$C_{12}$alkoxy; or $R_{46}$ and $R_{47}$ together are $C_2$-$C_6$alkylene optionally interrupted by —O— or —$NR_{44}$— and/or optionally substituted by hydroxyl, $C_1$-$C_4$alkoxy, $C_2$-$C_4$alkanoyloxy or benzoyloxy; $R_4$ is $C_1$-$C_{12}$alkyl, phenyl, $C_1$-$C_{12}$alkylphenyl or 2-(2'-tetrahydrofuryl)-phenyl. Specific examples thereof are 1,2-octanedione 1-[4-(phenylthio)phenyl]-2-(O-benzoyloxime), ethanone 1-[9-ethyl-6-(2-methylbenzoyl)-9H-carbazol-3-yl]-1-(O-acetyloxime) and 9H-thioxanthene-2-carboxaldehyde 9-oxo-2-(O-acetyloxime).

A further example of a photoinitiator is Esacure® 1001 available from Lamberti: 1-[4-(4-benzoylphenylsulfanyl)phenyl]-2-methyl-2-(4-methylphenylsulfonyl)propan-1-one

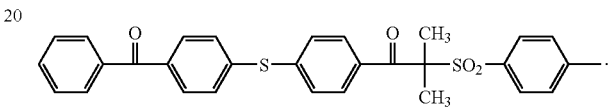

The most preferred photoinitiators are the following compounds:

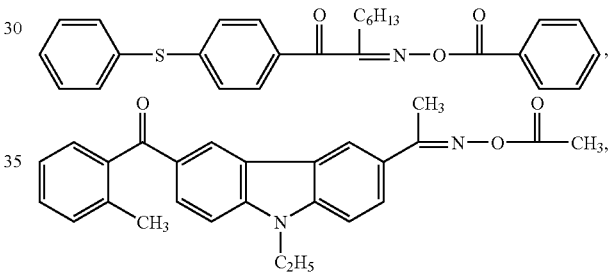

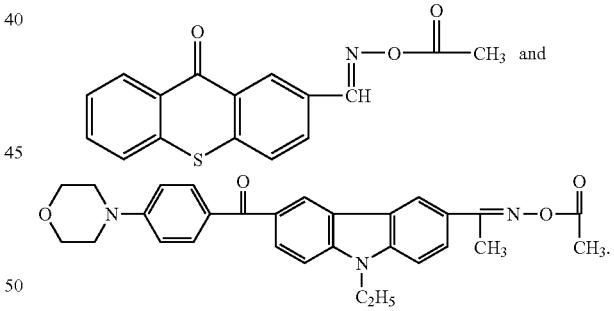

The photoinitiator may be used in combination with a sensitizer and/or a photostabiliser.

The total content of the photoinitiator is preferably from 0.01 to 10% by weight, preferably from 0.05 to 8% by weight, and particularly preferably from 1 to 5% by weight, based on the solid content of the composition.

Upon preparation of the dye-containing curable composition, a solvent is generally used. The solvent is not particularly limited as far as it satisfies solubility to the respective components and coating property of the dye-containing curable composition and it is preferably selected under particular consideration of the solubility of the alkali-soluble binder, the coating property and the safety.

Suitable solvents include esters, e.g. ethyl acetate, butyl acetate, butyl butyrate and methyl methoxyacetate, ether esters such as 1-methoxy-2-propyl-acetate (PGMEA), 2-methoxy-1-propyl-acetate, methylcellosolve acetate, diethylene glycol dimethyl ether, butylcarbitol acetate and polyethylene glycol methyl ether acrylate (PEGMEA), ethers, e.g. tetrahydrofuran, ketones, e.g. 2-butanone, cyclopentanone and cyclohexanone, and aromatic hydrocarbons such as toluene and xylene.

The examples which follow illustrate the invention, without limiting it. Where not otherwise specified, "parts" and "%" are by weight Volume parts correspond to weight parts of water.

COMPARATIVE EXAMPLE 1

92 parts of Heliogen® Blue D6700T (ε copper phthalocyanine, BASF) and 8 parts of phthalimidomethyl copper phthalocyanine are kneaded at 90° C. for 15 hours in a 1000 volume parts kneader with 100 parts of diethylene glycol and 700 parts of ground sodium chloride. This kneading chip is then poured into 1% aqueous HCl solution, and the resulting slurry is heated to about 70° C. for 2 hours while being stirred. The slurry is filtrated, and the filtercake is washed with water until the filtrate is free of chloride ions. The wet filtercake is reslurried and treated under high shear at 70° C. for 2 hours while be stirring and adjusting pH 7.5 with aqueous sodium hydroxide, then filtrated and washed with water until the filtrate is neutral. The filtercake of the ε copper phthalocyanine composition is finally dried at 90° C. and dry-ground at 50° C. Extremely tiny particles are obtained, which however have a poor rheology and do not lead to a better contrast.

EXAMPLE 1a 92 parts of β copper phthalocyanine crude and 8 parts of phthalimidomethyl copper phthalocyanine are acid pasted in concentrated sulphuric acid for 4 hours at 40° C. (1 part copper phthalocyanine: 8 parts $H_2SO_4$), then drowned-out into water using an exit aspirator unit. The slurry is filtrated, and the α copper phthalocyanine/phthalimidomethyl copper phthalocyanine filtercake is washed with water until the filtrate is acid free.

EXAMPLE 1b 80 parts of the product of example 1a, 18.4 parts of ε copper phthalocyanine (D6700T™, BASF) and 1.6 parts of phthalimidomethyl copper phthalocyanine are kneaded at 12° C. for 12 hours in a 1000 volume parts kneader with 100 parts of diethylene glycol and 500 parts of ground sodium chloride. This kneading chip is then poured into water, and the resulting slurry is heated to about 70° C. for 2 hours while being stirred. The slurry is filtrated, and the filtercake is washed with water until the filtrate is free of chloride ions. The wet filtercake is reslurried and treated under high shear at 70° C. for 2 hours while stirring and adjusting the pH to 7.5 with aqueous sodium hydroxide, then filtrated and washed with water until the filtrate is neutral. The ε copper phthalocyanine filtercake is finally dried at 90° C. and dry-ground at 50° C.

EXAMPLE 1c 80 parts of the product of example 1a and 20 parts of the product of example 1b are kneaded at 120° C. for 12 hours in a 1000 volume parts kneader with 100 parts of diethylene glycol and 500 parts of ground sodium chloride followed by further kneading at 90° C. for 8 hours after adding 5 parts of lauryl ammonium monosulfo copper phthalocyanine. This kneading chip is then poured into water, and the resulting slurry is heated to about 70° C. for 2 hours while being stirred. The slurry is filtrated, and the filtercake is washed with water until the filtrate is free of chloride ions. The wet filtercake is reslurried and treated under high shear at 70° C. for 2 hours while stirring and adjusting the pH to 7.5 with aqueous sodium hydroxide, then filtrated and washed with water until the filtrate is neutral. The filtercake of the ε copper phthalocyanine composition is finally dried at 90° C. and dry-ground at 50° C. The BET specific surface area is between 85 and 95 $m^2/g$, with particles in the range from 20 to 50 nm and a very narrow particles size distribution.

EXAMPLE 2

80 parts of the product of example 1a, 20 parts of the product of example 1b and 5 parts of lauryl ammonium monosulfo copper phthalocyanine are kneaded at 120° C. for 12 hours in a 1000 volume parts kneader with 100 parts of diethylene glycol and 500 parts of ground sodium chloride followed by further kneading at 90° C. for 8 hours. This kneading chip is then poured into water, and the resulting slurry is heated to about 70° C. for 2 hours while being stirred. The slurry is filtrated, and the filtercake is washed with water until the filtrate is free of chloride ions. The wet filtercake is reslurried and treated under high shear for 2 hours while stirring and adjusting the pH to 7.6 with aqueous sodium hydroxide, then filtrated and washed with water until the filtrate is neutral. The filtercake of the ε copper phthalocyanine composition is finally dried at 90° C. and dry-ground at 50° C.

EXAMPLE 3

80 parts of the product of example 1a, 20 parts of the product of example 1b and 5 parts of lauryl ammonium monosulfo copper phthalocyanine are kneaded at 120° C. for 12 hours in a 1000 volume parts kneader with 100 parts of diethylene glycol and 500 parts of ground sodium chloride followed by further kneading at 105° C. for 8 hours. This kneading chip is then poured into water, and the resulting slurry is heated to about 70° C. for 2 hours while being stirred. The slurry is filtrated, and the filtercake is washed with water until the filtrate is free of chloride ions. The wet filtercake is reslurried and treated under high shear at 70° C. for 2 hours while stirring and adjusting the pH to 7.5 with aqueous sodium hydroxide, then filtrated and washed with water until the filtrate is neutral. The filtercake of the ε copper phthalocyanine composition is finally dried at 90° C. and dry-ground at 50° C.

EXAMPLES 4-8

The following substances are charged into a 37 ml screw bottle;
  1.0 g Pigments (as indicated in below table);
  10.0 g Propylene glycol 1-monomethyl ether 2-acetate;
  0.04 g Solsperse® 5000 (Lubrizol);
  0.36 g Ajisper® PB821 (Ajinomoto Fine-Techno Co., Inc.);
  4.0 g Poly(benzylmethacrylate-co-methacrylic acid (25% in 1-methoxy-2-propylacetate, weight ratio of benzylmethacrylate: methacrylic acid 80:20;
  50.0 g zirconium oxide beads (diameter 0.5 mm).

The bottle is sealed with an inner cup then applied to a paint conditioner for 3 hours to give a dispersion. The viscosity of the dispersion is measured with a rheometer (LVDV-III™, Brookfield Engineering).

The dispersion thus obtained is cast onto a glass substrate by means of spin coating, wherein a layer thickness is adjusted to give a film having a desired color points by controlling rotation speed, then dried at 60° C. for 1 hour.

The optical properties of the dispersion films thus obtained are measured by use of a spectrophotometer (UV-2500PC™, Shimadzu) and color points (C.I.E. 1931x, y chromaticity diagram) are calculated using standard C light, observation 2 degree. Contrast ratio of the films is measure by a contrast tester (CT-1, Tsubosaka Electric Co., Ltd.).

The results are as follows:

| | | Optical properties at y = 0.0850 by C light, 2° | | Contrast | Viscosity (cps) | |
|---|---|---|---|---|---|---|
| Example | Pigment | x | Y | ratio | Initial | 1 week |
| 4 | Lionol ® Blue E[†] | 0.1322 | 8.20 | 2470 | 20.3 | >100 |
| 5 | Comparative example 1 | 0.1328 | 8.38 | 2580 | 30.0 | >100 |
| 6 | Example 1c | 0.1331 | 8.38 | 3180 | 10.5 | 14.6 |
| 7 | Example 2 | 0.1329 | 8.22 | 2850 | 15.4 | 21.1 |
| 8 | Example 3 | 0.1326 | 8.34 | 3240 | 15.4 | 18.6 |

[†]Toyo Ink Mfg. Co. Ltd.

EXAMPLE 9

It is proceeded in analogy to examples 1a, 1b, 2 and 7, with the difference that, instead of the quantities indicated therein, 93.87 parts of β copper phthalocyanine crude and 6.13 parts of phthalimidomethyl copper phthalocyanine are used in example 1a; 18.77 parts of ε copper phthalocyanine and 1.23 parts of phthalimidomethyl copper phthalocyanine are used in example 1b; and 2.04 parts of lauryl ammonium monosulfo copper phthalocyanine are used in example 1c. The optical properties are similar to those of example 7, with a slightly improved viscosity:

| | | Optical properties at y = 0.0850 by C light, 2° | | | Viscosity (cps) | |
|---|---|---|---|---|---|---|
| Example | Pigment | x | Y | Contrast ratio | Initial | 1 week |
| 9 | | 0.1328 | 8.46 | 2840 | 13.5 | 12.3 |

EXAMPLES 10-13

It is proceeded in close analogy to example 9, with the difference that the ratio of α copper phthalocyanine to ε copper phthalocyanine (4:1 in example 9) was 1:1 (example 10), 2:1 (example 11), 6:1 (example 12) and 10:1 (example 13), respectively. The results are similar to those of example 9, with the highest contrast ratio for example 11 and the lowest contrast ratio for examples 10 and 13.

EXAMPLE 14

It is proceeded in close analogy to example 9, with the difference that, instead of the quantities indicated therein, 94.85 parts of β copper phthalocyanine crude and 5.15 parts of dimethylaminomethyl (instead of phthalimidomethyl) copper phthalocyanine are used in example 1a; 18.97 parts of ε copper phthalocyanine and 1.03 parts of dimethylaminomethyl (instead of phthalimidomethyl) copper phthalocyanine are used in example 1b; and 3.09 parts of lauryl ammonium monosulfo copper phthalocyanine are used in example 1c. The optical properties are similar to those of example 7.

EXAMPLE 15

It is proceeded in close analogy to example 9, with the difference that, instead of the quantities indicated therein, 89.7 parts of β copper phthalocyanine crude and 10.3 parts of aminomethyl (instead of phthalimidomethyl) copper phthalocyanine are used in example 1a; 17.94 parts of ε copper phthalocyanine and 2.06 parts of aminomethyl (instead of phthalimidomethyl) copper phthalocyanine are used in example 1b; and 3.09 parts of lauryl ammonium monosulfo copper phthalocyanine are used in example 1c. The optical properties are similar to those of example 7.

EXAMPLE 16

It is proceeded in close analogy to example 9, with the difference that, instead of the quantities indicated therein, 96.48 parts of β copper phthalocyanine crude and 3.52 parts of dimethylaminomethyl (instead of phthalimidomethyl) copper phthalocyanine are used in example 1a; 19.30 parts of ε copper phthalocyanine and 0.70 parts of dimethylaminomethyl (instead of phthalimido) copper phthalocyanine are used in example 1b; and 17.65 parts of stearyl (instead of lauryl) ammonium monosulfo copper phthalocyanine are used in example 1c. The optical properties are similar to those of example 7.

EXAMPLE 17

It is proceeded in close analogy to example 9, with the difference that, instead of the quantities indicated therein, 84.55 parts of β copper phthalocyanine crude and 15.45 parts of phthalimidomethyl copper phthalocyanine are used in example 1a; 16.91 parts of ε copper phthalocyanine and 3.09 parts of phthalimidomethyl copper phthalocyanine are used in example 1b; and 3.09 parts of lauryl ammonium monosulfo copper phthalocyanine are used in example 1c. The contrast ratio is excellent (better than in example 8), but the viscosity is much poorer.

EXAMPLE 18

It is proceeded in close analogy to example 9, with the difference that, instead of the quantities indicated therein, 82.76 parts of β copper phthalocyanine crude and 17.24 parts of phthalimidomethyl copper phthalocyanine are used in example 1a; 16.55 parts of ε copper phthalocyanine and 3.45 parts of phthalimidomethyl copper phthalocyanine are used in example 1b; and 14.94 parts of lauryl ammonium monosulfo copper phthalocyanine are used in example 1c. The contrast ratio is good (better than in example 7), but the viscosity is not fully satisfactory.

EXAMPLE 19

It is proceeded in close analogy to example 9, with the difference that, instead of the quantities indicated therein, 80.0 parts of β copper phthalocyanine crude and 20.0 parts of dimethylaminomethyl (instead of phthalimidomethyl) copper phthalocyanine are used in example 1a; 16.0 parts of ε copper phthalocyanine and 4.0 parts of dimethylaminomethyl (instead of phthalimidomethyl) copper phthalocyanine are used in example 1b; and 11.11 parts of stearyl (instead of lauryl) ammonium monosulfo copper phthalocyanine are used in example 1c. The contrast ratio is good, but the viscosity is not fully satisfactory.

The invention claimed is:

1. A process for the preparation of a pigment composition, comprising the steps of:

wet-milling a mixture of α copper phthalocyanine and ε copper phthalocyanine, wherein the ratio of α copper phthalocyanine to ε copper phthalocyanine at the beginning of wet-milling is from 1:99 to 99:1, together with an aminomethyl-substituted phthalocyanine of formula (I), or a mixture thereof, and a milling aid in an organic liquid;

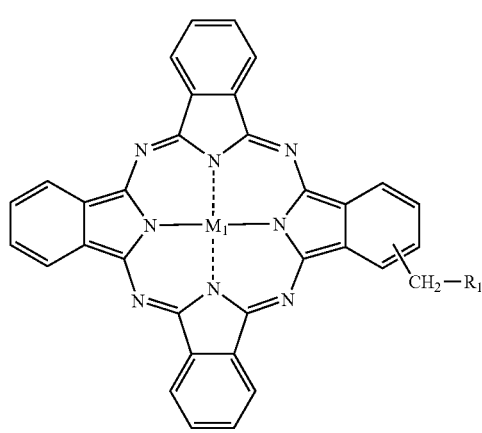

(I)

wherein $M_1$ is 2 H, Al(Cl), Al(OH), Bi(OH), Ca, Cd, Ce(Cl), Cr(OH), Co, Cu, Mn, Fe, Fe(Cl), Fe(OH), In(Cl), Mg, Mn(O), Ni, Os, Pb, Pd, Pt, Re, Rh, Rh(O), Ru, Si(Cl)$_2$, Si(OC$_1$-C$_5$alkyl)$_2$, Si(OH)$_2$, Sn, Sr, Ti(O), V(O), Zn, Zr(O) or Zr(OH)$_2$;

$R_1$ is

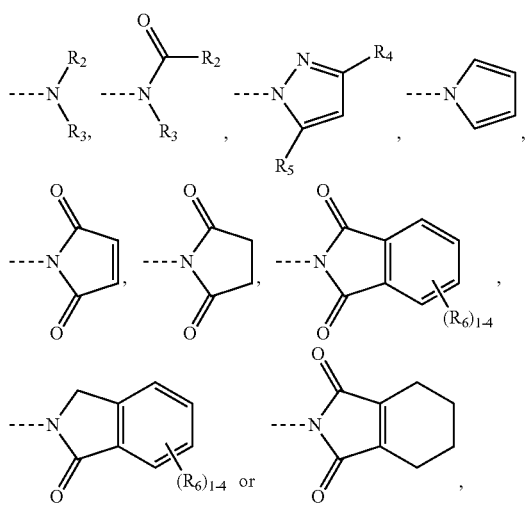

$R_2$ is

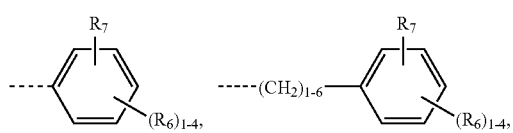

$C_1$-$C_{20}$alkyl, $C_2$-$C_{20}$alkenyl, [$C_2$-$C_6$alkylen-O—]$_{1-3}$H, [$C_2$-$C_6$alkylen-O—]$_{1-3}$$C_1$-$C_8$alkyl, [$C_2$-$C_6$alkylen-NH—]$_{1-3}$$C_1$-$C_8$alkyl or [$C_2$-$C_6$alkylen-N($C_1$-$C_4$alkyl)-]$_{1-3}$$C_1$-$C_8$alkyl;

$R_3$ is H, $C_1$-$C_{20}$alkyl, $C_2$-$C_{20}$alkenyl, [$C_2$-$C_6$alkylen-O—]$_{1-3}$H, [$C_2$-$C_6$alkylen-O—]$_{1-3}$$C_1$-$C_8$alkyl or [$C_2$-$C_6$alkylen-N($C_1$-$C_4$alkyl)-]$_{1-3}$$C_1$-$C_8$alkyl;

$R_4$ and $R_5$ are independently from one another H or $C_1$-$C_6$alkyl;

each $R_6$ is independently from all others H, $C_1$-$C_8$alkyl, Cl or NO$_2$; and $R_7$ is H, COOH, CONH$_2$, CONHC$_1$-C$_8$alkyl or CON(C$_1$-C$_8$alkyl)$_2$;

adding an ammonium sulfonato phthalocyanine of formula (II), or a mixture thereof, before the milling aid and the organic liquid are separated from the wet-milled mixture;

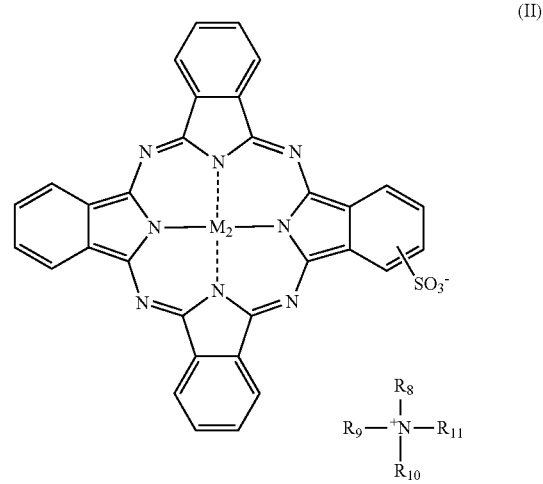

(II)

wherein $M_2$ is 2 H, Al(Cl), Al(OH), Bi(OH), Ca, Cd, Ce(Cl), Cr(OH), Co, Cu, Mn, Fe, Fe(Cl), Fe(OH), In(Cl), Mg, Mn(O), Ni, Os, Pb, Pd, Pt, Re, Rh, Rh(O), Ru, Si(Cl)$_2$, Si(OC$_1$-C$_5$alkyl)$_2$, Si(OH)$_2$, Sn, Sr, Ti(O), V(O), Zn, Zr(O) or Zr(OH)$_2$;

$R_8$ and $R_9$ are each independently of one another H or $C_1$-$C_4$alkyl;

$R_{10}$ is H, phenyl, benzyl, 2-phenylethyl, naphthyl, $C_1$-$C_{20}$alkyl, $C_8$-$C_{20}$alkenyl, [$C_2$-$C_6$alkylen-O—]$_{1-6}$H, [$C_2$-$C_6$alkylen-O—]$_{1-6}$$C_1$-$C_8$alkyl, [$C_2$-$C_6$alkylen-NH—]$_{1-6}$$C_1$-$C_8$alkyl or [$C_2$-$C_6$alkylen-N($C_1$-$C_4$alkyl)-]$_{1-6}$—$C_1$-$C_6$alkyl; and $R_{11}$ is $C_8$-$C_{20}$alkyl, $C_8$-$C_{20}$alkenyl, [$C_2$-$C_6$alkylen-O—]$_{3-6}$H, [$C_2$-$C_6$alkylen-O—]$_{3-6}$$C_1$-$C_8$alkyl, [$C_2$-$C_6$alkylen-NH—]$_{3-6}$$C_1$-$C_8$alkyl or [$C_2$-$C_6$alkylen-N($C_1$-$C_4$alkyl)-]$_{3-6}$$C_1$-$C_8$alkyl;

with the proviso that the total number of carbon atoms in $R_8$, $R_9$, $R_{10}$ and $R_{11}$ is from 8 to 30;

separating the milling aid and the organic liquid from the wet-milled mixture after addition of the ammonium salt of formula (II); and isolating the pigment composition;

wherein the thus isolated pigment composition comprises, by weight based on the total content of components having a phthalocyanine core, from 70 to 93% of ε copper phthalocyanine;

from 5 to 18% of the aminomethyl-substituted phthalocyanine of formula (I) or mixture thereof;

from 2 to 15% of the ammonium sulfonato phthalocyanine of formula (II) or mixture thereof; and
from 0 to 2% of other phthalocyanine compounds.

2. A process according to claim 1, wherein the pigment composition comprises from 6 to 20% by weight, based on the total content of components having a phthalocyanine core, of the aminomethyl-substituted phthalocyanine of formula (I) or mixture thereof plus the ammonium sulfonato phthalocyanine of formula (II) or mixture thereof, and the molar ratio of the aminomethyl-substituted phthalocyanine of formula (I) or mixture thereof to the ammonium sulfonato phthalocyanine of formula (II) or mixture thereof is from 1:1 to 5:1.

3. A process according to claim 1, wherein the ratio of α copper phthalocyanine to ε copper phthalocyanine at the beginning of wet-milling is from 1:4 to 20:1.

4. A process according to claim 1, wherein the wet-milling step is performed in an agitated media pearl mill with an insoluble inert solid material or in a kneader with a crystalline organic compound or inorganic salt.

5. A process according to claim 4, wherein the temperature during kneading is from 10 to 180° C.

6. A process according to claim 1, wherein the ammonium sulfonato phthalocyanine of formula (II) is added before the end of the wet-milling.

7. A process according to claim 1, wherein in formula I
$M_1$ is 2 H, Co, Cu or Ni;
$R_4$ and $R_5$ are both H or both methyl;
and in formula II
$M_2$ is 2 H, Co, Cu or Ni;
$R_8$ and $R_9$ are each independently of one another H or methyl; and
$R_{11}$ is $C_8$-$C_{20}$alkyl or $C_8$-$C_{20}$ alkenyl.

8. A process according to claim 7, wherein the ratio of α copper phthalocyanine to ε copper phthalocyanine at the beginning of wet-milling is from 1:4 to 20:1.

9. A process according to claim 1, wherein the wet-milling step is performed in a kneader with an inorganic salt.

10. A pigment composition comprising, by weight based on the total content of components having a phthalocyanine core,
a from 70 to 93% of ε copper phthalocyanine;
from 5 to 18% of aminomethyl-substituted phthalocyanine of formula (I) or mixture thereof, (I)

wherein $M_1$ is 2 H, Al(Cl), Al(OH), Bi(OH), Ca, Cd, Ce(Cl), Cr(OH), Co, Cu, Mn, Fe, Fe(Cl), Fe(OH), In(Cl), Mg, Mn(O), Ni, Os, Pb, Pd, Pt, Re, Rh, Rh(O), Ru, Si(Cl)$_2$, Si(OC$_1$-C$_5$alkyl)$_2$, Si(OH)$_2$, Sn, Sr, Ti(O), V(O), Zn, Zr(O) or (OH)$_2$;

$R_1$ is $C_1$-$C_{20}$alkyl, $C_2$-$C_{20}$alkenyl, [$C_2$-$C_6$alkylen-O—]$_{1-3}$H, [$C_2$-$C_6$alkylen-O—]$_{1-3}$$C_1$-$C_8$alkyl, [$C_2$-$C_6$alkylen-NH—]$_{1-3}$$C_1$-$C_8$alkyl or [$C_2$-$C_6$alkylen-N($C_1$-$C_4$alkyl)-]$_{1-3}$$C_1$-$C_8$alkyl;
$R_3$ is H, $C_1$-$C_{20}$alkyl, $C_2$-$C_{20}$alkenyl, [$C_2$-$C_6$alkylen-O—]$_{1-3}$H, [$C_2$-$C_6$alkylen-O—]$_{1-3}$ $C_1$$C_8$alkyl or [$C_2$-$C_6$alkylen-N($C_1$-$C_4$alkyl)-]$_{1-3}$$C_1$-$C_8$alkyl;
$R_4$ and $R_5$ are independently from one another H or $C_1$-$C_6$alkyl;
each $R_6$ is independently from all others H, $C_1$-$C_8$alkyl, Cl or NO$_2$; and
$R_7$ is H, COOH, CONH$_2$, CONHC$_1$-$C_8$alkyl or CON(C$_1$-$C_8$alkyl)$_2$;
from 2 to 15% of ammonium sulfonato phthalocyanine of formula (II) or mixture thereof (II)

wherein $M_2$ is 2 H, Al(Cl), Al(OH), Bi(OH), Ca, Cd, Ce(Cl), Cr(OH), Co, Cu, Mn, Fe, Fe(Cl), Fe(OH), In(Cl), Mg, Mn(O), Ni, Os, Pb, Pd, Pt, Re, Rh, Rh(O), Ru, Si(Cl)$_2$, Si(OC$_1$-C$_5$alkyl)$_2$, Si(OH)$_2$, Sn, Sr, Ti(O), V(O), Zn, Zr(O) or Zr(O)$_2$;

$R_8$ and $R_9$ are each independently of one another H or C$_1$-C$_4$alkyl;

$R_{10}$ is H, phenyl, benzyl, 2-phenylethyl, naphthyl, C$_1$-C$_{20}$alkyl, C$_8$-C$_{20}$alkenyl, [C$_2$-C$_6$alkylen-O—]$_{1-6}$H, [C$_2$-C$_6$alkylen-O—]$_{1-6}$C$_1$-C$_8$alkyl, [C$_2$-C$_6$alkylen-NH—]$_{1-6}$C$_1$-C$_8$alkyl or [C$_2$-C$_6$alkylen-N(C$_1$-C$_4$alkyl)-]$_{1-6}$C$_1$-C$_8$alkyl; and $R_{11}$ is C$_8$-C$_{20}$alkyl, C$_8$-C$_{20}$alkenyl, [C$_2$-C$_6$alkylen-O—]$_{3-6}$H, [C$_2$-C$_6$alkylen-O—]$_{3-6}$C$_1$-C$_8$alkyl, [C$_2$-C$_6$alkylen-NH—]$_{3-6}$C$_1$-C$_8$alkyl or [C$_2$-C$_6$alkylen-N(C$_1$-C$_4$alkyl)-]$_{3-6}$C$_1$-C$_8$alkyl;

with the proviso that the total number of carbon atoms in $R_8$, $R_9$, $R_{10}$ and $R_{11}$ is from 8 to 30; and from 0 to 2% of other phthalocyanine compounds.

11. A pigment composition according to claim 10, which has a specific surface area of from 50 to 110 m$^2$/g, as determined by the BET method.

12. A composition according to claim 10 further comprising an organic material having a molecular weight in the range of 10$^3$ to 10$^8$ g/mol.

13. A composition comprising from 0.1 to 70% by weight of the phthalocyanine pigment composition according to claim 10 and a liquid medium comprising a binder or a polymerisable compound.

14. A pigment composition according to claim 10, which has a specific surface area of from 80 to 110 m$^{2/}$g.

15. A colour filter comprising a transparent substrate and one layer or multiple layers thereon, wherein at least one layer comprises from 1 to 75% by weight of the phthalocyanine pigment composition according to claim 10 based on the overall weight of the layer.

* * * * *